(12) United States Patent
Baumgartl et al.

(10) Patent No.: US 10,074,566 B2
(45) Date of Patent: Sep. 11, 2018

(54) SEMICONDUCTOR DEVICE AND METHODS FOR FORMING A PLURALITY OF SEMICONDUCTOR DEVICES

(71) Applicant: Infineon Technologies AG, Neubiberg (DE)

(72) Inventors: Johannes Baumgartl, Riegersdorf (AT); Manfred Engelhardt, Villach-Landskron (AT); Oliver Hellmund, Neubiberg (DE); Iris Moder, Villach (AT); Ingo Muri, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/596,961

(22) Filed: May 16, 2017

(65) Prior Publication Data

US 2017/0338153 A1  Nov. 23, 2017

(30) Foreign Application Priority Data

May 18, 2016 (DE) ........................ 10 2016 109 165

(51) Int. Cl.

| | |
|---|---|
| *H01L 21/301* | (2006.01) |
| *H01L 21/78* | (2006.01) |
| *H01L 21/306* | (2006.01) |
| *H01L 21/311* | (2006.01) |
| *H01L 21/683* | (2006.01) |

(Continued)

(52) U.S. Cl.
CPC ............ *H01L 21/78* (2013.01); *H01L 21/304* (2013.01); *H01L 21/30604* (2013.01); *H01L 21/31111* (2013.01); *H01L 21/6835* (2013.01); *H01L 21/76895* (2013.01); *H01L 23/528* (2013.01); *H01L 29/0657* (2013.01); *H01L 21/02013* (2013.01); *H01L 21/3043* (2013.01); *H01L 21/82* (2013.01); *H01L 2221/68327* (2013.01)

(58) Field of Classification Search
CPC ...................... H01L 21/02013; H01L 21/3043; H01L 21/82
USPC ....................................................... 438/462
See application file for complete search history.

(56) References Cited

U.S. PATENT DOCUMENTS

| | | | | |
|---|---|---|---|---|
| 5,565,682 A | * | 10/1996 | Frank ........................ | G01J 5/34 250/332 |
| 5,623,158 A | * | 4/1997 | Frank ................ | H01L 31/02161 257/436 |
| 8,637,967 B2 | * | 1/2014 | Menath ............... | H01L 23/3114 257/618 |
| 9,099,547 B2 | * | 8/2015 | Martens .................. | H01L 22/14 |
| 2003/0143819 A1 | * | 7/2003 | Hedler .................... | H01L 21/78 438/462 |

(Continued)

*Primary Examiner* — George Fourson, III
(74) *Attorney, Agent, or Firm* — Slater Matsil, LLP

(57) ABSTRACT

A method for forming a plurality of semiconductor devices includes forming a plurality of trenches extending from a first lateral surface of a semiconductor wafer towards a second lateral surface of the semiconductor wafer. The method further includes filling a portion of the plurality of trenches with filler material. The method further includes thinning the semiconductor wafer from the second lateral surface of the semiconductor wafer to form a thinned semiconductor wafer. The method further includes forming a back side metallization layer structure on a plurality of semiconductor chip regions of the semiconductor wafer after thinning the semiconductor wafer. The method further includes removing a part of the filler material from the plurality of trenches after forming the back side metallization layer structure to obtain the plurality of semiconductor devices.

32 Claims, 17 Drawing Sheets

(51) Int. Cl.
*H01L 21/768* (2006.01)
*H01L 23/528* (2006.01)
*H01L 29/06* (2006.01)
*H01L 21/02* (2006.01)
*H01L 21/304* (2006.01)
*H01L 21/82* (2006.01)

(56) References Cited

U.S. PATENT DOCUMENTS

| | | |
|---|---|---|
| 2004/0113283 A1 | 6/2004 | Farnworth et al. |
| 2007/0087532 A1* | 4/2007 | Bauer .............. H01L 21/67132 |
| | | 438/460 |
| 2008/0318396 A1* | 12/2008 | Shin ................... H01L 21/561 |
| | | 438/462 |
| 2011/0156217 A1* | 6/2011 | Kalnitsky ............... H01L 21/78 |
| | | 257/620 |
| 2013/0157436 A1* | 6/2013 | Hummler .......... H01L 21/76898 |
| | | 438/424 |
| 2013/0249079 A1 | 9/2013 | Lee et al. |
| 2013/0299950 A1* | 11/2013 | Hummler ............ H01L 23/3677 |
| | | 257/622 |
| 2014/0167209 A1 | 6/2014 | Meiser et al. |
| 2015/0262880 A1* | 9/2015 | Kato ...................... H01L 21/78 |
| | | 438/462 |
| 2016/0276176 A1* | 9/2016 | Kamphuis ................ H01L 24/94 |
| 2017/0200647 A1* | 7/2017 | Stering ................... H01L 21/78 |
| 2017/0236803 A1* | 8/2017 | Zaal ................. H01L 21/76898 |
| | | 361/767 |
| 2017/0338153 A1* | 11/2017 | Baumgartl .............. H01L 21/78 |

* cited by examiner

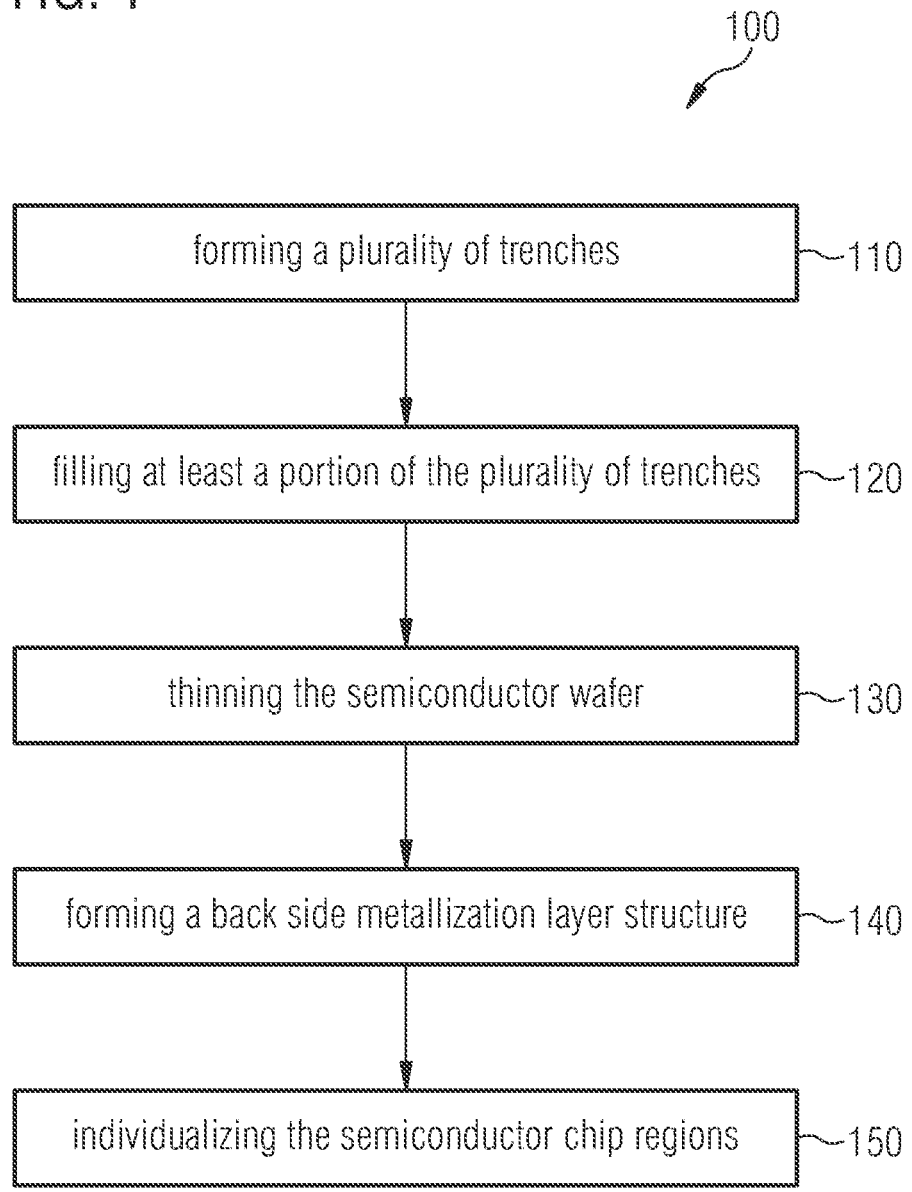

SEMICONDUCTOR DEVICE AND METHODS FOR FORMING A PLURALITY OF SEMICONDUCTOR DEVICES

CROSS-REFERENCE TO RELATED APPLICATIONS

This application claims the benefit of DE Application No. 102016109165.0 filed on May 18, 2016, which application is hereby incorporated herein by reference.

TECHNICAL FIELD

Embodiments relate to a semiconductor device and methods for forming a plurality of semiconductor device.

BACKGROUND

Semiconductor devices (e.g. semiconductors dies or semiconductor chips) of a semiconductor wafer may be subjected to various effects due to process or techniques used for die separation. For example, critical hairline cracks may be formed in the individual semiconductor devices. Furthermore, individual semiconductor devices may suffer from stress due to mechanical dicing after grinding on the dies and/or contamination or damages of the prepared front side structures. Thin dies (e.g. between 4 µm and 50 µm or e.g. in the range of 30 to 50 µm or e.g. in the range of 10 to 80 µm, e.g. 30 µm, 50 µm or 60 µm or thinner than 40 µm) may be at risk of suffering from hairline cracks, which may dramatically reduce yield and may cause electrical failures in field, for example.

SUMMARY

It is a demand to provide concepts for forming a plurality of semiconductor devices with higher yield and/or reduced electrical failures.

Such a demand may be satisfied by the subject matter of the claims.

Some embodiments relate to a method for forming a plurality of semiconductor devices. The method comprises forming a plurality of trenches extending from a first lateral surface of a semiconductor wafer towards a second lateral surface of the semiconductor wafer. The method further comprises filling at least a portion of the plurality of trenches with filler material. The method further comprises thinning the semiconductor wafer from the second lateral surface of the semiconductor wafer to form a thinned semiconductor wafer. The method further comprises forming a back side metallization layer structure on a plurality of semiconductor chip regions of the semiconductor wafer after thinning the semiconductor wafer. The plurality of semiconductor chip regions of the semiconductor wafer is located between the plurality of trenches. The method further comprises individualizing the semiconductor chip regions of the semiconductor wafer by removing at least part of the filler material from the plurality of trenches after forming the back side metallization layer structure to obtain the plurality of semiconductor devices.

Some embodiments relate to a further method for forming a plurality of semiconductor devices. The method comprises forming filler material on a first sidewall and on an opposite second sidewall of a trench of a plurality of trenches extending from a first lateral surface of a semiconductor wafer towards a second lateral surface of the semiconductor wafer. The trench of the plurality of trenches is located between neighboring semiconductor chip regions of the semiconductor wafer. A trench void remains between the filler material located on the first sidewall of the trench of the plurality of trenches and the filler material located on the second sidewall of the trench of the plurality of trenches. The method further comprises individualizing the neighboring semiconductor chip regions of the semiconductor wafer by enlarging the distance between the first sidewall of the trench of the plurality of trenches and the second sidewall of the trench of the plurality of trenches.

Some embodiments relate to a further method for forming a plurality of semiconductor devices. The method comprises forming a plurality of trenches extending from a first lateral surface of a semiconductor wafer towards a second lateral surface of the semiconductor wafer. The method further comprises filling at least a portion of the plurality of trenches with filler material. The method further comprises forming thinned portions of a plurality of semiconductor chip regions of the semiconductor wafer by thinning portions of the semiconductor wafer between neighboring trenches of the plurality of trenches from the second lateral surface of the semiconductor wafer to a first thickness. Each semiconductor chip region of the plurality of semiconductor chip regions comprises an edge portion located at an edge of the semiconductor chip region after forming the plurality of thinned portions of the plurality of semiconductor chip regions. Each edge portion of the semiconductor chip region has a second thickness. The second thickness is larger than the first thickness.

Some embodiments relate to a semiconductor device. The semiconductor device comprises a back side metallization layer structure formed on a thinned portion of a semiconductor substrate. The thinned portion of the semiconductor substrate has a first thickness. The semiconductor device further comprises an edge portion of the semiconductor substrate located at the back side of the semiconductor substrate at an edge of the semiconductor substrate. The edge portion of the semiconductor substrate has a second thickness. The second thickness is larger than the first thickness.

BRIEF DESCRIPTION OF THE DRAWINGS

Some embodiments of apparatuses and/or methods will be described in the following by way of example only, and with reference to the accompanying figures, in which FIG. 1 shows a flow chart of a method for forming a plurality of semiconductor devices;

DETAILED DESCRIPTION OF ILLUSTRATIVE EMBODIMENTS

Figure 2A:
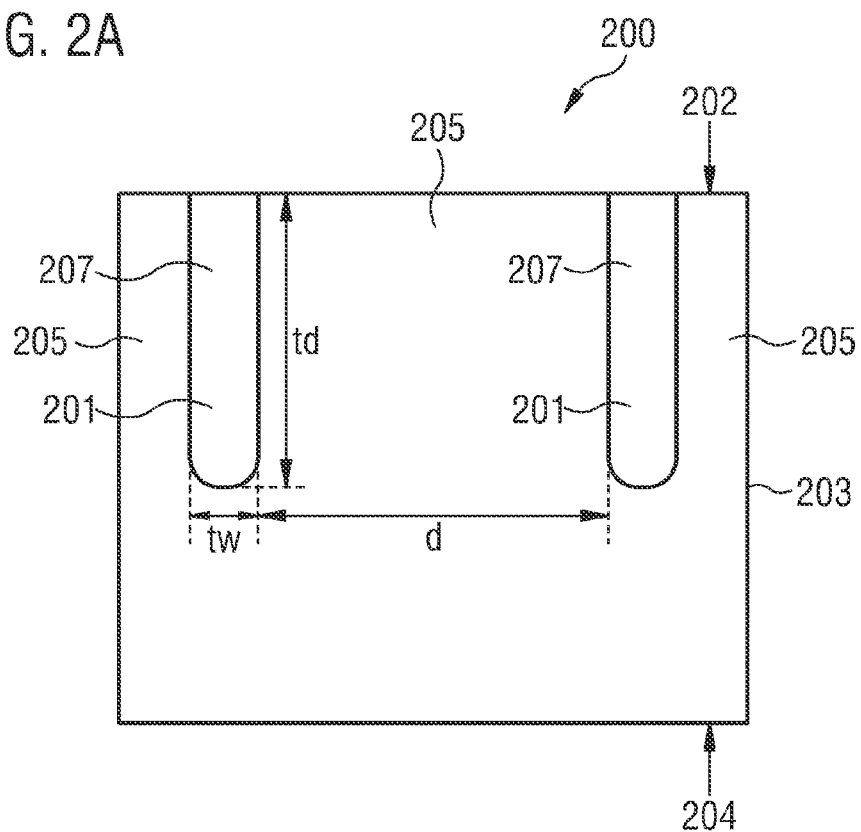
FIGS. 2A to 2G show schematic illustrations of a method for forming a plurality of semiconductor devices.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

FIG. 1 shows a flow chart of a method 100 for forming a plurality of semiconductor devices.

The method 100 comprises forming no a plurality of trenches extending from a first lateral surface of a semiconductor wafer towards a second lateral surface of the semiconductor wafer.

The method 100 further comprises filling 120 at least a portion of the plurality of trenches with filler material.

The method 100 further comprises thinning 130 the semiconductor wafer from the second lateral surface of the semiconductor wafer to form a thinned semiconductor wafer.

The method 100 further comprises forming 140 a back side metallization layer structure on a plurality of semiconductor chip regions of the semiconductor wafer after thinning the semiconductor wafer. The plurality of semiconductor chip regions of the semiconductor wafer is located between the plurality of trenches.

The method 100 further comprises individualizing 150 the semiconductor chip regions of the semiconductor wafer by removing at least part of the filler material (e.g. by wet or dry etching or expansion of the underlying carrier foil) from the plurality of trenches after forming the back side metallization layer structure to obtain the plurality of semiconductor devices.

Due to individualizing 150 the semiconductor chip regions of the semiconductor wafer by removing at least part of the filler material (e.g. by wet or dry etching or expansion of the underlying carrier foil) from the plurality of trenches, effects caused by mechanical separation techniques such as hairline cracks, may be avoided, for example. Due to individualizing 150 the semiconductor chip regions of the semiconductor wafer after forming the back side metallization layer structure, the back side metallization layer structure may be formed on the plurality of semiconductor chip regions with improved accuracy, for example.

Forming 110 the plurality of trenches may include etching (e.g. by wet chemical etching, and/or e.g. by dry chemical or plasma etching, or e.g. by anisotropic etching) the semiconductor wafer from the first lateral surface using lithographic techniques, for example. For example, forming no the plurality of trenches may include etching the plurality of trenches at portions of the first lateral surface not covered by a photolithographic mask, for example.

The plurality of trenches may extend (substantially) vertically into the semiconductor wafer from the first (or the front) lateral surface of the semiconductor wafer towards the opposite second lateral surface of the semiconductor wafer, for example. Additionally, the plurality of trenches may have a dimension extending in a first lateral direction (e.g. a trench length) farther than in an orthogonal second lateral direction (e.g. a trench lateral width).

An average lateral width, $t_w$, (shown in FIG. 2A) of a (or e.g. each) trench of the plurality of trenches located between neighboring (or e.g. adjacent, or e.g. consecutive, or e.g. directly consecutive) semiconductor chip regions of the plurality of semiconductor chip regions may lie between 500 nm and 50 µm (or e.g. between 10 µm and 30 µmm, or e.g. between 10 µm and 20 µm). Additionally or optionally, an average lateral width of each trench of the plurality of trenches located between the neighboring semiconductor chip regions of the plurality of semiconductor chip regions may be less than 15 µm (or e.g. less than 500 nm or less than 300 nm), for example. The lateral width of a trench of the plurality of trenches may be a lateral dimension of the trench measured in the second lateral direction between two parallel opposite sidewalls of the trench, for example. The average lateral width of the trench may be a characteristic dimension measured between the sidewalls of more than 50% (or e.g. more than 60%) of a lateral length of the trench ignoring end portions of the trench, for example. The lateral width of a trench of the plurality of trenches may be (or e.g. may be equal to, or may be referred to as) a kerf width of a kerf region between a first semiconductor device to be formed and a neighboring second semiconductor device to be formed.

A minimum (or e.g. smallest) trench depth, $t_d$, (shown in FIG. 2A) of a (or e.g. each) trench of the plurality of trenches may lie between 4 µm and 200 µm (or e.g. between 4 µm and 100 µm, or e.g. between 4 µm and 40 µm), for example. The minimum depth of each trench may be a smallest distance between the surface level (of the first lateral surface) of the semiconductor wafer and a bottom of the trench, for example. The minimum depth of the plurality of trenches may be substantially equal to (or e.g. may lie within +/−10%, or e.g. within +/−5%, or +/−1% of) the thickness of the thinned semiconductor wafer after thinning the semiconductor wafer, for example.

The plurality of trenches may have a vertical extension (e.g. a vertical depth). For example, the plurality of trenches may be laminar structures or may have the geometry of a wall or plate. In a cross-section orthogonal to the lateral length (or the first lateral direction) of the stripe-shaped trenches, the stripe-shaped trenches may have a pillar shape, for example. The plurality of trenches may be striped-shaped, and may be arranged substantially in parallel to each other (e.g. neglecting manufacturing tolerances) in the semiconductor wafer. Each trench of the plurality of trenches may include sidewalls (e.g. the first sidewall and the opposite second sidewall) extending into the semiconductor wafer and a trench bottom connecting the sidewalls of the trench, for example.

Each trench of the plurality of trenches may comprise a lateral length (in the first lateral direction, L1) of more than 10× (or more than 50× or more than 100×) a minimum lateral width (in the second lateral direction, L2) of the trench, for example. The lateral length of the trench may be the largest lateral dimension or largest extension along (or parallel to) a lateral surface of the semiconductor wafer. The lateral width of the trench at the first lateral surface of the semiconductor wafer may be a minimum lateral dimension of the trench at the first lateral surface of the semiconductor substrate extending along (or parallel to) the surface of the semiconductor wafer. The lateral width of each trench at the first lateral surface of the semiconductor substrate may be the same or may vary by less than +/−5% (or e.g. less than +/−2%, or e.g. less than +/−1%) over more than 95%, or e.g. more than 99% of the lateral length of the trench.

The plurality of semiconductor chip regions of the semiconductor wafer is located between the plurality of trenches. For example, a (or e.g. one, or e.g. each) semiconductor chip region may be located between two (substantially parallel) neighboring (or e.g. adjacent, or e.g. consecutive, or e.g. directly consecutive) trenches of the plurality of trenches in the second lateral direction.

Additionally or optionally, each semiconductor chip region may have a quadratic (e.g. rectangular, or e.g. a square) geometry and may be laterally surrounded (in a top view) on each side of the semiconductor chip region by at least part of one trench. For example, each semiconductor chip region may be laterally surrounded (in a top view) by four trenches, for example.

Additionally or optionally, a (or e.g. one, or e.g. each) trench of the plurality of trenches may be located between two neighboring semiconductor chip regions of the plurality of semiconductor chip regions in the second lateral direction. For example, the plurality of semiconductor chip regions and the plurality of trenches may be arranging alternatingly with respect to each other in the second lateral direction.

A minimum (or e.g. smallest) lateral distance, d, (shown in FIG. 2A) between neighboring (e.g. directly consecutive, or e.g. laterally adjacent) trenches of the plurality of trenches may be larger than 50 nm (or e.g. larger than 100 nm, or e.g. larger than 1 µm, or e.g. larger than 10 µm, or e.g. larger than 100 µm, or e.g. larger than 1 mm), for example. For example, the minimum lateral distance between neighboring trenches of the plurality of trenches may lie between 50 nm and several millimeters, (or e.g. between 10 µm and 10 mm, or e.g. between 50 µm and 10 mm), for example. The minimum lateral distance between the neighboring trenches of the plurality of trenches may be a smallest distance or spacing between a sidewall of a first trench of the plurality of trenches and a nearest (or closest) sidewall of a neighboring second trench of the plurality of trenches, for example.

The minimum lateral distance between the neighboring trenches of the plurality of trenches may be substantially equal to (or may be used to define) a lateral dimension of a semiconductor device (e.g. a semiconductor chip, or e.g. a semiconductor die) to be formed by the method 100. For example, the minimum lateral distance between the neighboring trenches of the plurality of trenches may be substantially equal to a lateral dimension of a semiconductor chip region of the semiconductor device in which at least part of one electrical structure of the semiconductor device is to be formed, for example.

Filling 120 at least a portion of the plurality of trenches with filler material may include filling at least a portion (or at least part of) each trench of the plurality of trenches with the filler material, for example. Filling 120 at least a portion of the plurality of trenches with filler material may include depositing (e.g. by chemical vapor deposition) the filler material in each trench of the plurality of trenches. Alternatively, filling 120 at least a portion of the plurality of trenches with filler material may include using an oxidation processes (e.g. a thermal oxidation process) to form (or e.g. grow) the filler material in each trench of the plurality of trenches, for example.

The filler material may be a carbon (C) based material, a silicon nitride (SiNx) based material, a silicon dioxide (SiO$_2$) based material, an amorphous silicon carbide (a-SiC) based material, a glue (e.g. an adhesive) or a stretchable material, for example. The stretchable material may be an elastic material and/or a glue, for example. For example, an elastic modulus of the stretchable material may lie between 0.01 and 50 GPA (or e.g. between 0.1 and 10 GPA) at room temperature (e.g. 300 k) or e.g. also in the range of 200K to 500K (e.g. around 300K or between 200K and 400K). The glue (or adhesive) may be an organic material (e.g. SU-8 or e.g. benzocyclobutene), for example.

Filling 120 at least a portion of the plurality of trenches with filler material may include substantially filling each trench of the plurality of trenches with the filler material. For example, more than 60% (or e.g. more than 95%, or e.g. more than 99%) each trench of the plurality of trenches may be filled with the filler material. For example, the filler material may (completely) fill each trench of the plurality of trenches ignoring voids (e.g. air voids) having a maximum (lateral and/or vertical) dimension of less than 5% (or e.g. less 1%) of an average lateral width of each trench of the plurality of trenches.

Optionally or alternatively, filling 120 at least a portion of the plurality of trenches with filler material may include forming the filler material in each trench of the plurality of trenches so that a trench void (e.g. an air void) is formed in each trench of the plurality of trenches. A minimum vertical dimension of the trench void may be at least 5% (or e.g. at least 60%, or e.g. at least 70%, or e.g. at least 80%) of a minimum trench depth of the trench of the plurality of trenches. Additionally or optionally, a minimum lateral dimension of the trench void may be at least 10% (or e.g. at least 40%, or e.g. at least 70%, or e.g. at least 80%) of a lateral width of the trench of the plurality of trenches, for example.

Optionally or additionally, filling 120 at least a portion of the plurality of trenches with filler material may include forming one or more different filler material portions of the filler material. For example, filling 120 at least a portion of the plurality of trenches with filler material may include forming a first filler material portion of the filler material and a different second filler material portion of the filler material in each trench of the plurality of trenches.

The method 100 may further include forming at least part of at least one electrical structure of a semiconductor device in a semiconductor chip region of the plurality of semiconductor chip regions after filling at least the portion of the plurality of trenches with the filler material and before thinning 130 the semiconductor wafer. For example, the at least one electrical structure may be formed in each semiconductor chip region of the plurality of semiconductor chip regions.

The at least one electrical structure may include (or may be) at least part of a diode structure, or at least part of a transistor structure (e.g. a MOSFET transistor structure, or an IGBT transistor structure), for example. For example, forming the at least one electrical structure may include forming a cathode or anode region of a diode structure in the semiconductor chip region. For example, forming the at least one electrical structure may include forming (e.g. implanting) a body region, a source region and/or a drift region of a transistor structure in the semiconductor chip region, for example. For example, forming the at least one electrical structure may further include forming a metallization layer structure (e.g. a source electrode structure, or e.g. a gate electrode structure, or e.g. an anode structure) of the at least one electrical structure at (or e.g. on) the first lateral surface of the semiconductor wafer.

Thinning 130 the semiconductor wafer may include removing semiconductor wafer material from the second lateral surface of semiconductor wafer to uncover the plurality of trenches comprising the filler material at the second lateral surface of the thinned semiconductor wafer.

Optionally, thinning 130 the semiconductor wafer may include grinding the semiconductor wafer at (or from) the second lateral surface of the semiconductor wafer. The grinding of the semiconductor wafer may reduce a thickness of the semiconductor wafer to at least 50% (or e.g. at least 4%) of the original thickness of the semiconductor wafer (e.g. the thickness of the semiconductor wafer before the thinning 130 the semiconductor wafer). For example, the grinding of the semiconductor wafer may reduce a thickness of the semiconductor wafer from more than 700 µm to a thickness of between (15 µm and 100 µm, or e.g. between 20 µm and 50 µm, or e.g. between 20 µm and 30 µm). Optionally, at least part of the plurality of trenches may be removed from the second lateral surface of the semiconductor wafer during the grinding of the semiconductor wafer at the second lateral surface of the semiconductor wafer, for example.

Thinning 130 the semiconductor wafer may further include etching the semiconductor wafer at (or from) the second lateral surface of the semiconductor wafer after grinding the semiconductor wafer. The etching of the semiconductor wafer may reduce the thickness of the semiconductor wafer by a further thickness of between 200 nm and 30 µm (or e.g. between 200 nm and 6 µm, or e.g. between 300 nm and 500 nm), for example.

A maximum thickness of the thinned semiconductor wafer after thinning the semiconductor wafer (e.g. after etching the semiconductor wafer) may lie between 3 µm and 200 µm (or e.g. between 2 µm and 100 µm, between 5 µm and 100 µm, between 10 µm and 100 µm, between 10 µm and 50 µm, between 20 µm and 30 µm or e.g. between 4 µm and 20 µm), for example. The thickness of the thinned semiconductor wafer may be a dimension or distance measured substantially vertically from the first lateral surface of the thinned semiconductor wafer to the second lateral surface of the thinned semiconductor wafer, for example.

Optionally, etching the semiconductor wafer may include selectively etching the semiconductor wafer with respect to the etching the plurality of trenches (e.g. the plurality of trenches are not etched during the etching of the semiconductor wafer, or e.g. the plurality of trenches may be etched at an etch rate of more than 100 times less than the etch rate of the semiconductor wafer during the etching of the semiconductor wafer). Thus, the maximum (or largest) thickness of the thinned semiconductor wafer after thinning the semiconductor wafer may be less than the minimum trench depth of the plurality of trenches (e.g. of each trench of the plurality of trenches), for example.

Optionally, thinning 130 the semiconductor wafer may be carried out (e.g. by etching) from the second lateral surface of the semiconductor wafer until an etch stop layer structure of the semiconductor wafer is uncovered at the second lateral surface of the thinned semiconductor wafer. For example, the etch stop layer structure of the semiconductor wafer may be a buried etch stop layer structure (e.g. buried oxide) located (vertically) between a first semiconductor portion of the semiconductor wafer and a second semiconductor portion of the semiconductor wafer. For example, the first lateral surface of the semiconductor wafer may be located at (a front facing side of) the first semiconductor portion of the semiconductor wafer. For example, the second lateral surface of the semiconductor wafer may be located at (a back facing side of) the second semiconductor portion of the semiconductor wafer. For example, the etch stop layer structure of the semiconductor wafer may be located between the first semiconductor portion of the semiconductor wafer and the second semiconductor portion of the semiconductor wafer at an etch stop depth (or etch stop level).

Figure 3A:
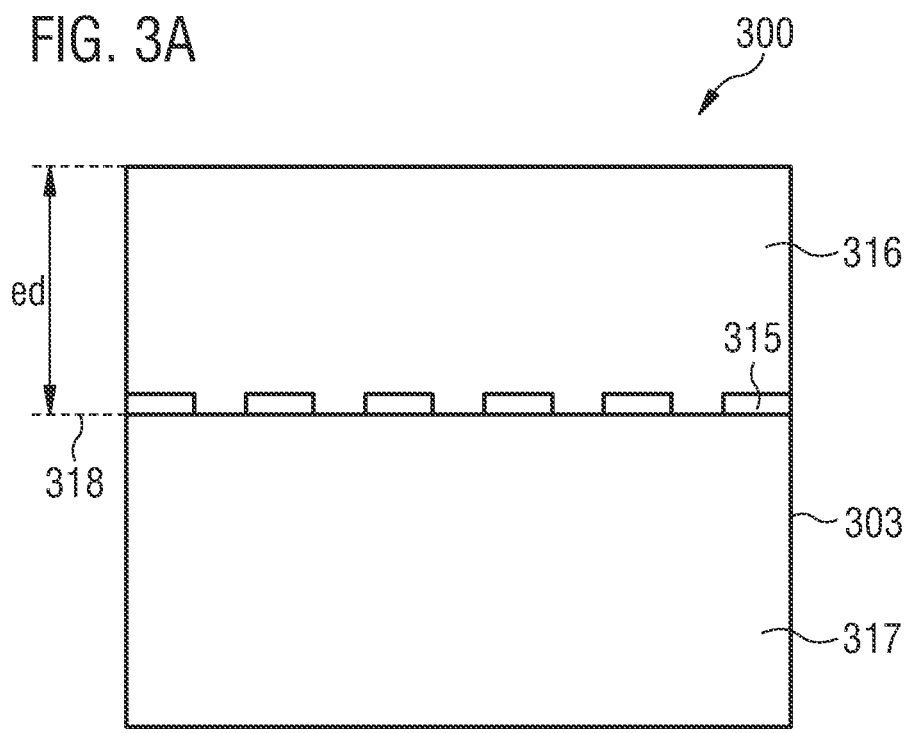
FIGS. 3A to 3G show schematic illustrations of a method for forming a plurality of semiconductor devices using a etch stop layer structure.

The etch stop depth may be a vertical depth, (or vertical level), ed, (as shown in FIG. 3A) of the etch stop layer structure measured from the first lateral surface of the semiconductor wafer to a bottom (or back side facing side) of the etch stop layer structure, for example. The maximum etch stop depth of the etch stop layer structure may lie between 4 µm and 200 µm (for e.g. between 4 µm and 100 µm, or e.g. between 4 µm and 40 µm), for example. Optionally, the thickness of the thinned wafer portion after thinning the semiconductor wafer may be substantially equal to (or e.g. may lie within +/−10%, or e.g. within +/−5%, or +/−1%) of the etch stop depth of the etch stop layer structure of the semiconductor wafer, for example.

Optionally, the semiconductor wafer may be a silicon-on-insulator (SOI) wafer, for example. In which case, the etch stop layer structure may be located (vertically, e.g. vertically sandwiched) between the first semiconductor portion of the semiconductor wafer and a second semiconductor portion of the semiconductor wafer. For example, the etch stop layer structure may be formed by implanting oxygen to form a buried oxide etch stop layer structure between the first semiconductor portion of the semiconductor wafer and the second semiconductor portion of the semiconductor wafer. Optionally, the etch stop layer structure may be a continuous etch stop layer structure extending over the entire lateral area (or e.g. at least 70, or e.g. more than 90%, or e.g. more than 95%, or e.g. more than 99% of the lateral area) of the semiconductor wafer, for example.

Optionally or alternatively, the second semiconductor portion of the semiconductor wafer may be a substrate wafer portion of the semiconductor wafer. The substrate wafer portion of the semiconductor wafer may have the form (or may be) a semiconductor wafer, for example. The etch stop layer structure of the semiconductor wafer may be formed on a first lateral surface (e.g. front facing side) of the substrate wafer portion of the semiconductor wafer, for example. For example, the etch stop layer structure may be formed by depositing the etch stop layer structure on the first lateral surface of the substrate wafer portion of the semiconductor wafer. Optionally, the etch stop layer structure may be a discontinuous etch stop layer structure extending over at least 70% (or e.g. at least 50%, or e.g. at least 80%) of the lateral area of the semiconductor wafer, for example. For example, the etch stop layer structure may include a plurality of etch stop layer portions formed on the first lateral surface of the substrate wafer portion of the semiconductor wafer.

Additionally or optionally, the first semiconductor portion of the semiconductor wafer may be formed on the etch stop layer structure and at least part of the second semiconductor wafer portion after forming the etch stop layer structure. The first semiconductor portion of the semiconductor wafer may be an epitaxial portion of the semiconductor wafer (e.g. the first semiconductor portion of the semiconductor wafer may be formed by an epitaxial growth of the semiconductor wafer on the second semiconductor wafer portion). Thus, the etch stop layer structure may be located between the semiconductor wafer portion of the semiconductor wafer and the epitaxial portion of the semiconductor wafer.

The etch stop layer structure of the semiconductor wafer may extend laterally over at least 70% (or e.g. at least 80%, or e.g. at least 90%) of a lateral area of the semiconductor wafer, for example. The etch stop layer structure of the semiconductor wafer may be an electrically insulating layer (e.g. a silicon dioxide layer), for example.

If the semiconductor wafer includes the etch stop layer structure, forming no the plurality of trenches may include forming the plurality of trenches so that they extend from the first lateral surface of a semiconductor wafer to at least the vertical level (e.g. to the etch stop depth) of the etch stop layer structure of the semiconductor wafer. For example, the plurality of trenches may extend from the first lateral surface of a semiconductor wafer to the etch stop depth of the etch stop layer structure or deeper into the semiconductor wafer than the etch stop depth of the etch stop layer structure for example. For example, the minimum trench depth of the plurality of trenches may be substantially equal to or larger than the etch stop depth of the etch stop layer structure, for example.

Optionally or additionally, the plurality of trenches and the etch stop layer structure may be uncovered (e.g. exposed) at the second lateral surface of the thinned semiconductor wafer after thinning 130 the semiconductor wafer, for example.

The method 100 may further include removing at least part of the etch stop layer structure of the semiconductor wafer after thinning 130 the semiconductor wafer and before forming 140 the back side metallization layer structure on the plurality of semiconductor chip regions of the semiconductor wafer. For example, after (or once, or when) the etch stop layer structure of the semiconductor wafer is uncovered at the second lateral surface of the thinned semiconductor wafer, at least part of the etch stop layer structure (e.g. a portion of the etch stop layer structure located on the thinned semiconductor wafer or on a thinned portion of the semiconductor wafer) may be removed in an etch stop layer structure removal process.

The method 100 may further include etching the filler material located in the plurality of trenches from the second lateral surface of the semiconductor wafer after thinning 130 the semiconductor wafer so that a maximum depth of the plurality of trenches comprising filler material (after etching the filler material) is smaller (or e.g. less) than a thickness of the thinned semiconductor wafer. The etching of the filler material located in the plurality of trenches from the second lateral surface of the semiconductor wafer may be carried out after thinning 130 the semiconductor wafer and before forming 140 the back side metallization layer structure on the plurality of semiconductor chip regions of the semiconductor wafer, for example. Optionally, the etching of the filler material located in the plurality of trenches from the second lateral surface of the semiconductor wafer may be carried out before or after removing at least part of the etch stop layer structure of the semiconductor wafer after thinning 130 the semiconductor wafer, for example.

Forming 140 the back side metallization layer structure on the plurality of semiconductor chip regions of the semiconductor wafer may include forming a portion of the back side metallization layer structure on each semiconductor chip region of the plurality of semiconductor chip regions, for example. The portion of the back side metallization layer structure formed on a (or one) semiconductor chip region may be part of at least one electrical structure of a semiconductor device. For example, the portion of the back side metallization layer structure formed on a semiconductor chip region may be a drain electrode structure (or e.g. a cathode structure) of at least one electrical structure of the semiconductor device. Optionally, the forming 140 of the back side metallization layer structure on the plurality of semiconductor chip regions of the semiconductor wafer may be carried out by a photolithographic process. For example, a photolithographic mask may cover the plurality of trenches at the second lateral surface of the thinned semiconductor wafer and the plurality of semiconductor chip regions may be uncovered (e.g. not covered) by the photolithographic mask. Thus, the back side metallization layer structure may be formed (or e.g. deposited) on the plurality of semiconductor chip regions of the semiconductor wafer and not on areas covered by the photolithographic mask, for example. The back side metallization layer structure may be formed at the second lateral surface of the thinned semiconductor wafer, for example. Optionally, the back side metallization layer structure may be formed by a galvanic deposition process, for example.

The back side metallization layer structure may extend laterally over more than 50% (or more than 70% or more than 90%) of a semiconductor chip region and/or over more than 50% (or more than 70% or more than 90%) of each semiconductor chip region of the plurality of semiconductor chip regions. The back side metallization layer structure may be formed directly on the backside of the semiconductor wafer after thinning the semiconductor wafer so that the back side metallization layer structure is in contact with the semiconductor material of the semiconductor wafer at the back side of the semiconductor wafer. The back side metallization layer structure may be formed so that an ohmic contact exists between the back side metallization layer structure and a back side doping region of an electrical structure (e.g. vertical diode or vertical transistor) of a semiconductor device to be formed. The back side metallization layer structure may form an electrode (e.g. drain/source or collector/emitter electrode of a vertical transistor or a cathode/anode electrode of a diode) of an electrical structure of a semiconductor device to be formed. For example, the semiconductor chip region of each semiconductor device to be formed may be the lateral area of the semiconductor material of the semiconductor wafer remaining for each semiconductor device after individualizing or separating the semiconductor devices from each other.

Individualizing 150 the semiconductor chip regions of the semiconductor wafer may include removing (e.g. etching) at least part of (or e.g. all of) the filler material from the plurality of trenches after forming 140 the back side metallization layer structure. After removing at least part of the filler material from the plurality of trenches, a separation (e.g. a gap) may be formed between neighboring semiconductor chip regions of the plurality of semiconductor chip regions. Thus, each semiconductor chip region may be individualized or separated from other semiconductor chip regions of the plurality of semiconductor chip regions.

Optionally, the filler material may include one or more different filler material portions, for example. For example, a first filler material portion (e.g. $SiO_2$) of the filler material may be deposited on the sidewalls of a (or e.g. each) trench of the plurality of trenches. Additionally, a different second filler material portion (e.g. a glue) may be deposited in the trench between the first filler material portion located in the trench. Individualizing 150 the semiconductor chip regions of the semiconductor wafer may include modifying the second filler material portion from the plurality of trenches (or e.g. removing, or e.g. expanding, or e.g. breaking, or e.g. tearing the second filler material portion) to separate or individualize each semiconductor chip region from other semiconductor chip regions of the plurality of semiconductor chip regions, for example. The first or first and second filler material portion may remain on the vertical edge (or vertical sidewall) of the individualized semiconductor device after modifying the second filler material portion, for example. Thus, the first or first and second filler material portion may provide a sidewall passivation of the individualized semiconductor device. By depositing the trench walls with an isolation material (e.g. an oxide or nitride first filler material portion) or oxidation, and in combination with other trench fillers with or without voids, the passivated sidewalls may be used as part of package isolation after removal of trench filler (e.g. the second filler material portion). The sidewall passivation may also prevent any sidewall metallization at subsequent soldering processes, for example.

A (or one, or each) semiconductor device of the obtained plurality of semiconductor devices may include a (or one) semiconductor chip region include the at least one electrical structure formed in the semiconductor chip region, for example. The plurality of semiconductor devices obtained by the method 100 may be (or may refer to) a plurality of semiconductor chips and/or semiconductor dies, for example. Each semiconductor device may be a metal oxide semiconductor field effect transistor (MOSFET) device or an insulated gate bipolar transistor (IGBT) device, for example.

The semiconductor wafer (or substrate) may be a silicon wafer or may be wide band gap semiconductor wafer having a band gap larger than the band gap of silicon (1.1 eV). For example, the semiconductor wafer may be a silicon carbide (SiC)-based semiconductor wafer, or gallium arsenide (GaAs)-based semiconductor wafer, or a gallium nitride (GaN)-based semiconductor wafer. The semiconductor wafer may include a plurality of semiconductor die (or chip) portions, for example.

The semiconductor device to be manufactured may, optionally, be a power semiconductor device. A power semiconductor device or an electrical structure (e.g. transistor structure or diode structure) of the power semiconductor device may have a breakdown voltage or blocking voltage of 5V and higher (or e.g. more than 8V, boy and higher, more than 100V, or e.g. more than 500 V, or e.g. more than 1000 V, for example, breakdown voltage or blocking voltage e.g. in the range of 6 to 50V or e.g. in the range around 80V, or 100V, or 600V, or 1000V or even higher voltages), for example. Optionally or alternatively, the semiconductor device to be manufactured may be a non-power semiconductor device. For example, an electrical structure of the power semiconductor device may be a memory structure, or e.g. a circuit for a central processing unit (CPU).

The first lateral surface or front surface of the semiconductor wafer may be a surface of the semiconductor wafer towards metal layers, insulation layers and/or passivation layers on top of the surface of the substrate or a surface of one of these layers. For example, a semiconductor wafer front side may be the side at which active elements of the chip are formed. For example, in a power semiconductor chip, a chip front side may be a side of the chip at which a source region and a gate region are formed, and a chip back side may be a side of the chip at which a drain region is formed. For example, more complex structures may be located at the chip front side than at the chip back side.

A lateral surface of the semiconductor wafer may be a substantially even plane (e.g. neglecting unevenness of the semiconductor structure due to the manufacturing process and trenches). For example, the lateral dimension of the lateral surface of the semiconductor wafer may be more than 100 times larger (or more than 1000 times or more than 10000 times) than a maximal height of structures on the main surface. In comparison to a basically vertical edge of a semiconductor substrate of a semiconductor device (e.g. resulting from separating the semiconductor substrate of the semiconductor device or chip from other semiconductor devices), the lateral surface may be a basically horizontal surface extending laterally. The lateral dimension of the lateral surface of the semiconductor wafer may be more than 100 times larger (or more than 1000 times or more than 10000 times) than a basically vertical edge of the semiconductor wafer, for example.

The first lateral direction may be a direction substantially parallel to a lateral surface of the semiconductor wafer, for example. The second lateral direction may be a direction substantially parallel to the lateral surface of the semiconductor wafer, and orthogonal (or perpendicular) to the first lateral direction, for example. A vertical direction may be a direction orthogonal (or perpendicular) to the lateral surface of the semiconductor substrate, for example.

The method 100 may include dicing (e.g. forming the plurality of trenches) before grinding (DBG). For example, a plasma dicing before grinding (P-DBG) process may be carried out right at the beginning of any Power MOS front side processes. Following (or e.g. subsequent) front side processes are not affected by the P-DBG, for example. The first alignment marks and kerfs of future dies may be defined here. Right at the beginning of process flow, the generated trenches may be filled with a higher freedom of process variations. Non-outgassing (filler) materials (e.g. carbon, silicon oxide or a-SiC) may be deposited in an effective way, for example. The surface of wafers may be cleaned and planarized without consequences to following process flows. For example, after the thinning process, the wafer structure is still stable for follow-up processes. The filling (or filler) material may be etched by plasma, for example. Optionally, glue material may be included between front side of the thin wafer and on the carrier construction depending on the filling material. The glue may be also removed by a wet etch process, if $SiO_2$ is used as the filling material, for example.

The method 100 may be used for technologies with ultra-thin dies (4 µm up to 40 µm), for example. The method 100 may include using DBG and/or P-DBG (for forming the plurality of trenches defining the kerf regions) right at the beginning for forming the ultra-thin dies. The method 100 may be a cost effective way of producing high manufacturing yields without flying dies and any contamination of the front side structures, for example. The dicing step (or process) of method 100 may be carried out before any front side (FS) processes. Plasma dicing before grinding and filling of the kerfs with the (filler) material may be suitable for high temperature front end of line (FEOL) processing and removing this material after thinning the wafer, for example.

The method 100 avoids a thin die separation after grinding by using an (dry or wet) etch process or alternatively by expansion and picking, for example. Additionally or optionally, the method 100 may prevent or reduce critical hairline cracks while thin wafer processing. Additionally or optionally, the method 100 may prevent or reduce the stress of (mechanical) dicing after grinding on dies. Additionally or optionally, the method 100 may prevent or reduce contamination or damages of ready prepared front side structures. Additionally or optionally, the method 100 may avoid hard mask deposition and etching on top of final front side structures. Additionally or optionally, the method 100 may prevent or reduce flying dies at demounting, for example. Additionally or optionally, the method 100 may reduce the size (or dimensions) of the kerf regions between semiconductor devices of the semiconductor wafer. For example, the method 100 may reduce a minimum width of the kerf regions from at least 70 µm (which may be required in dicing by sawing processes) to less than 15 µm, for example. For example, the size (or e.g. the dimension, or e.g. the kerf width) of each kerf region between a first semiconductor device and a neighboring second semiconductor devices to be individualized may be determined by (or may be substantially equal to) the trench width between the first semiconductor device and the neighboring second semiconductor device.

Unlike method 100, power technologies which use dicing after grinding (DAG) (e.g. by sawing, half cut dicing or laser cutting) for thin and especially ultra-thin (less than 40 µm or e.g. less than 50 µm or e.g. less than 60 µm thick, or in the thickness range of 20 to 40 µm or e.g. also in the range of 5 to 80 µm) wafer technologies may face a rising risk of hairline cracks with consequence of dramatically reduced yield and even electrical failures in field. Warpage stress on wafer level may also be larger compared to chip level, for example.

The method 100 uses filling (or filler) materials in the trenches which may be easily and/or completely removable, for example. Thin dies may be easily separated without front side contamination. The materials may fill the trenches completely (e.g. to prevent sidewall metallization) and may withstand in-vacuum processes without outgassing, for example.

Other dicing before grinding (DBG) processes (by half cut dicing) may solve only one condition. For example, for LV (low voltage) SFET (semiconductor field effect transistor) technologies, dicing before grinding (DBG) (e.g. half cut dicing in combination with refilling of trenches) may be used. The separation may be realized directly after finishing front side processes. They may reduce hairline cracks, although contamination of the front side is still possible. Flying dies may also be critical in most DBG cases, for example. The trenches may be filled with material which has to be separated afterwards again (e.g. by laser) and additional costs may result.

Stealth laser dicing may be carried out before grinding. For required coupling laser light into silicon (or a related wafer base material), it may be used in combination with a low doped base material and highly doped epitaxial layers on top. However, in the cases of thin SFET technologies with highly-doped base material, it may be used only with limited performance. For Power MOS dies becoming thinner and smaller (according to Moore's law), the cost of mechanical and laser dicing may increase while plasma dicing will be more cost competitive. Calculating the cost parity, the target dicing depths and the plasma process conditions have to be defined in each case, for example.

FIGS. 2A to 2G show schematic illustrations of a method 200 (or process flow) for forming a plurality of semiconductor devices. Each of FIGS. 2A to 2G shows a two-dimensional view of at least part of a semiconductor wafer at a cross-section extending vertically through the semiconductor wafer.

The method 200 described in connection with FIGS. 2A to 2G may include one or more or all of the features of the method described in connection with FIG. 1, for example.

As shown in FIG. 2A, the method 200 may include forming a plurality of trenches 201 (e.g. dicing) extending from a first lateral surface 202 of a semiconductor wafer 203 towards a second lateral surface 204 of the semiconductor wafer 203.

The plurality of trenches 201 may extend (substantially) vertically into the semiconductor wafer 203 from the first (or the front) lateral surface 202 of the semiconductor wafer 203 towards the opposite second lateral surface 204 of the semiconductor wafer 203, for example. A (or e.g. one, or e.g. each) semiconductor chip region 205 may be located between two neighboring trenches 201 of the plurality of trenches 201, for example.

The method 200 may include filling at least a portion of the plurality of trenches with filler material 207 (e.g. C, SiNx, SiO$_2$, or SiC) by deposition or by thermal oxidation, for example. FIG. 2A shows the dicing and filling with the filler material, for example.

Figure 2B:
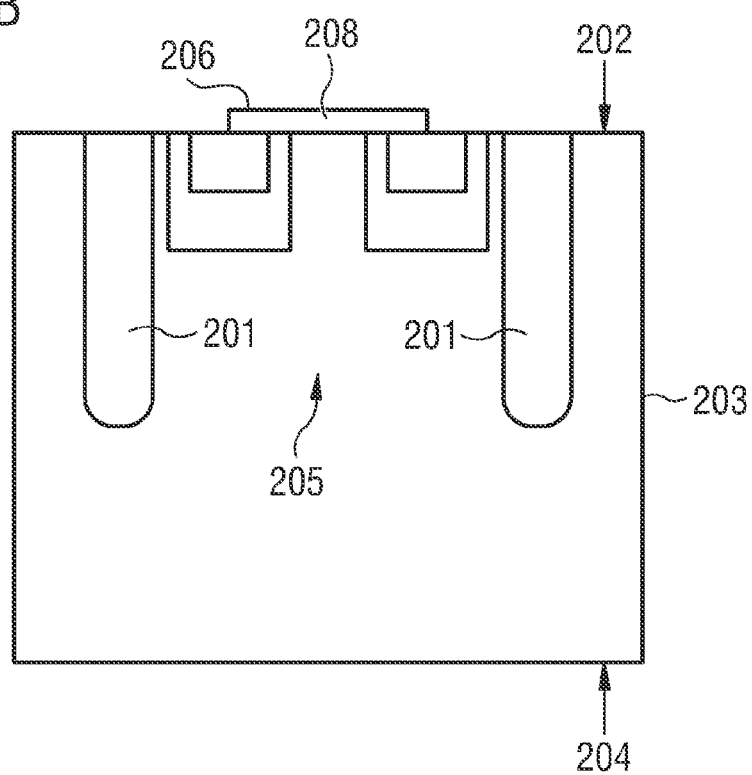

As shown in FIG. 2B, the method 200 may further include forming at least one electrical structure 206 of a semiconductor device (e.g. front end of line FEOL processing or e.g. device manufacturing) in a semiconductor chip region 205 of a plurality of semiconductor chip regions of the semiconductor wafer after filling at least the portion of the plurality of trenches 201 with the filler material 207.

For example, the at least one electrical structure 206 may be formed in each semiconductor chip region 205 of the plurality of semiconductor chip regions 205. For example, forming the at least one electrical structure may include forming a body region, a source region and/or a drift region of a transistor structure in the semiconductor chip region, for example. For example, forming the at least one electrical structure may further include forming a metallization layer structure 208 (e.g., a source electrode structure, or e.g. a gate electrode structure, or e.g. an anode structure) of the at least one electrical structure at (or e.g. on) the first lateral surface 202 of the semiconductor wafer.

Figure 2C:
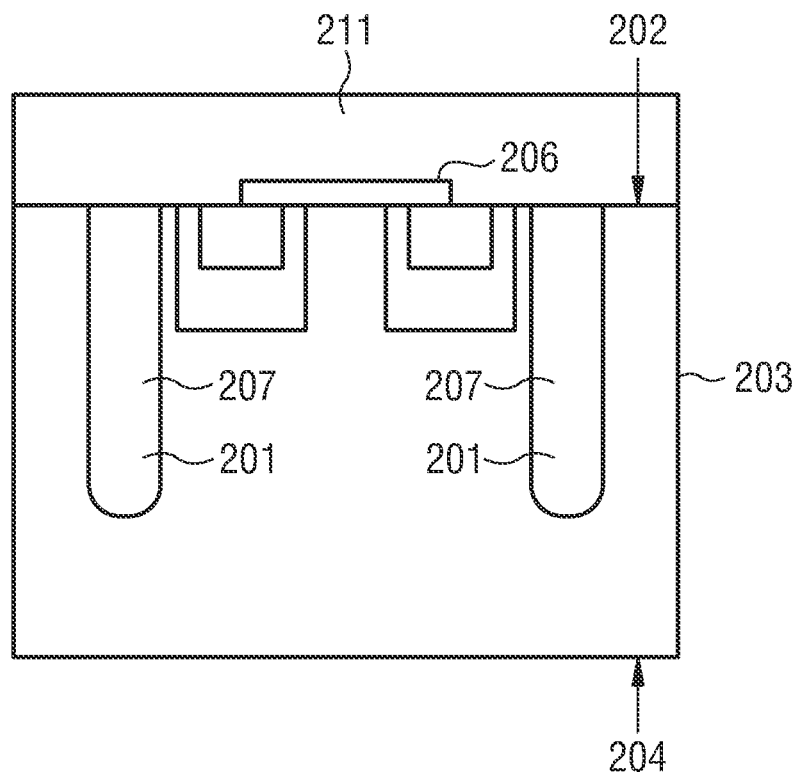

As shown in FIG. 2C, the method 200 may include arranging (or mounting) the semiconductor wafer on a carrier structure 211. For example, the first lateral surface 202 of the semiconductor wafer 203 may be mounted (or fixed temporarily) to the carrier structure 211.

Figure 2D:
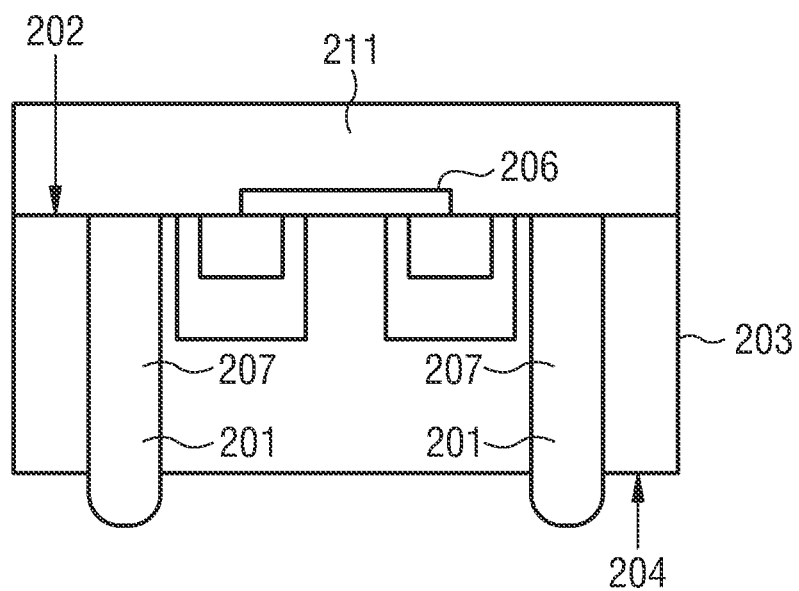

As shown in FIG. 2D, the method 200 may further include thinning the semiconductor wafer (e.g. by grinding and etching) from the second lateral surface of the semiconductor wafer to form a thinned semiconductor wafer 203 after arranging the semiconductor wafer 203 on the carrier structure 211.

Thinning the semiconductor wafer 203 may include removing semiconductor wafer material from the second lateral surface 204 of semiconductor wafer 203 to uncover the plurality of trenches 201 comprising the filler material 207 at the second lateral surface 204 of the thinned semiconductor wafer 203.

The maximum thickness of the thinned semiconductor wafer 203 after thinning the semiconductor wafer may be less than the minimum trench depth of the plurality of trenches (e.g. of each trench of the plurality of trenches).

Figure 2E:
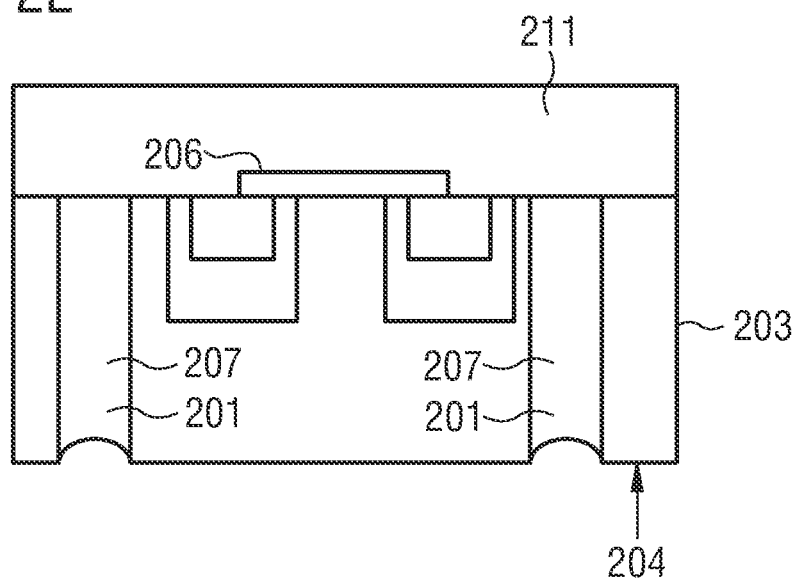

As shown in FIG. 2E, the method 200 may optionally further include etching the filler material 207 located in the plurality of trenches 201 from the second lateral surface 204 of the semiconductor wafer 203 after thinning the semiconductor wafer 203. For example, FIG. 2E shows the optional recess etch of the trench filler material 207, for example. A maximum depth of the plurality of trenches 201 comprising the filler material 207 after etching the filler material 207 may be less than a thickness of the thinned semiconductor wafer 203.

Figure 2F:
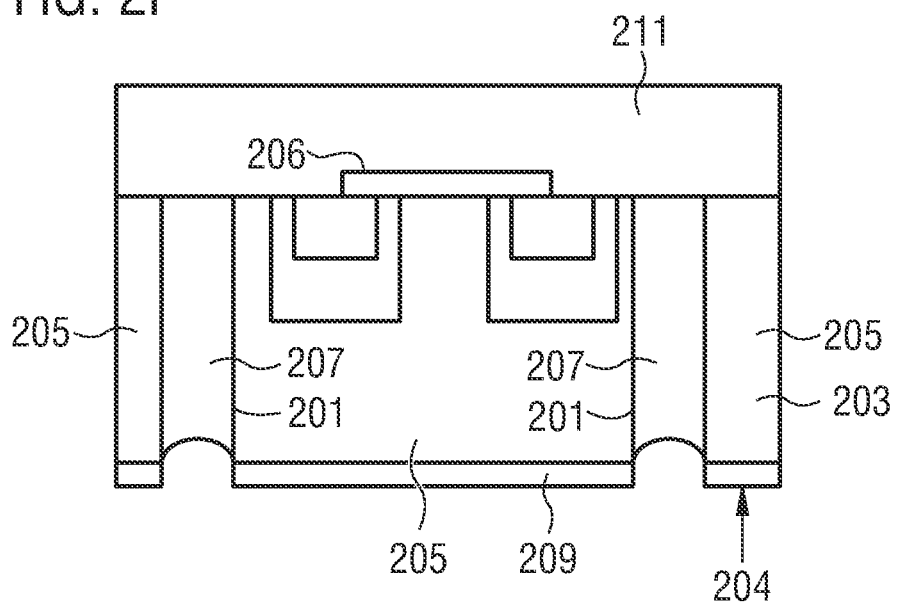

As shown in FIG. 2F, the method 200 may further include forming a back side metallization layer structure 209 on a plurality of semiconductor chip regions 205 of the semiconductor wafer 203 after thinning the semiconductor wafer 203. For example, FIG. 2F shows the back side (BS) processing metallization using (optionally) lithography, for example.

A portion of the back side metallization layer structure 209 formed on a semiconductor chip region 205 may be a drain electrode structure (or e.g. a cathode structure) of the at least one electrical structure 206 of a semiconductor device, for example.

Figure 2G:
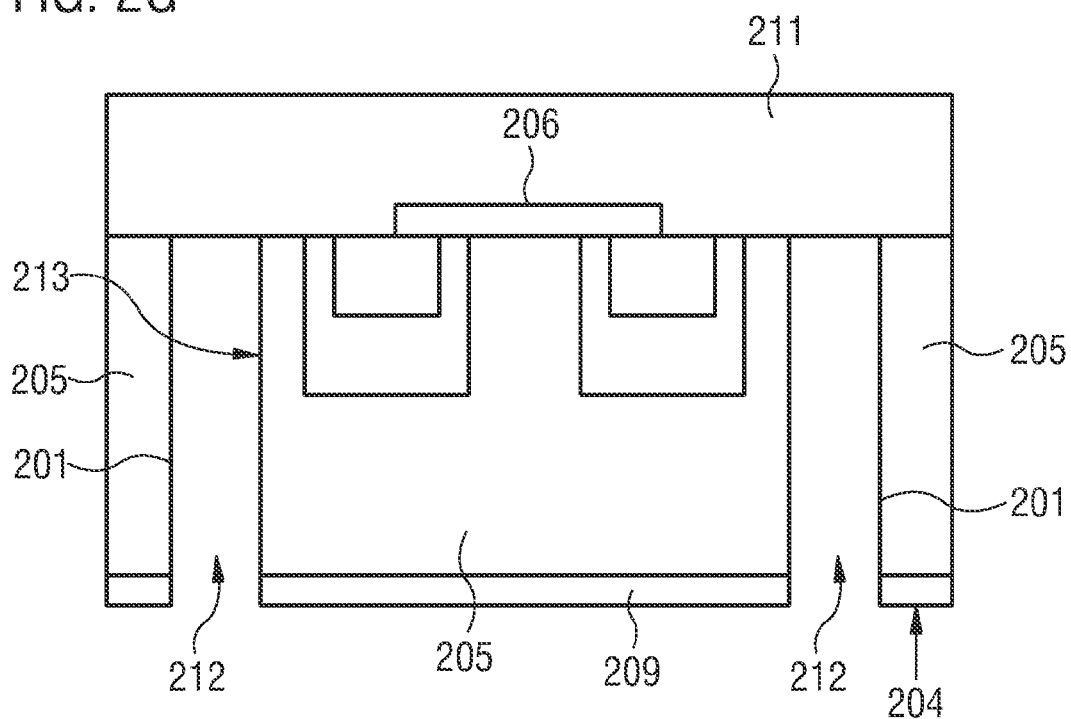

As shown in FIG. 2G, the method 200 may further include individualizing the semiconductor chip regions of the semiconductor wafer to obtain the plurality of semiconductor devices. Individualizing the semiconductor chip regions of the semiconductor wafer may include removing at least part of the filler (filling) material from the plurality of trenches 201 after forming the back side metallization layer structure 209, for example.

After removing at least part of the filler material from the plurality of trenches 201, a separation 212 (e.g. a gap) may be formed between neighboring semiconductor chip regions 205 of the plurality of semiconductor chip regions 205. Thus, each semiconductor chip region 205 may be individualized or separated from other semiconductor chip regions 205 (or e.g. from its neighboring semiconductor chip regions) of the plurality of semiconductor chip regions 205.

Each individualized (or separated) semiconductor device 213 of the plurality of semiconductor devices may include a (or one) semiconductor chip region 205 and the at least one electrical structure formed in the semiconductor chip region 205, for example.

The method 200 may further include removing the plurality of individualized semiconductor devices from the carrier structure 211 after individualizing the semiconductor chip regions 205 of the semiconductor wafer 203, for example.

More details and aspects are mentioned in connection with the embodiments described above or below. The embodiments shown in FIGS. 2A to 2G may each comprise one or more optional additional features corresponding to one or more aspects mentioned in connection with the proposed concept or one or more embodiments described above (e.g. FIG. 1) or below (e.g. FIGS. 3A to 10B).

FIGS. 3A to 3G show schematic illustrations of a method 300 for forming a plurality of semiconductor devices. Each of FIGS. 3A to 3G shows a two-dimensional view of at least part of a semiconductor wafer at a cross-section extending vertically through the semiconductor wafer. For example, FIGS. 3A to 3G shows a process flow using an etch stop.

The method 300 described in connection with FIGS. 3A to 3G may include one or more or all of the features of the methods described in connection with FIGS. 1 to 2G, for example.

As shown in FIG. 3A, the semiconductor wafer 303 may include an etch stop layer structure 315. For example, the etch stop layer structure 315 of the semiconductor wafer 303 may be a buried etch stop layer structure located (vertically) between a first semiconductor portion 316 of the semiconductor wafer 303 and a second semiconductor portion 317 of the semiconductor wafer 303 at an etch stop depth (or level) 318. For example, the semiconductor wafer 303 may be a substrate with a buried oxide (or SOI) and an epitaxial portion.

Optionally, the second semiconductor portion 317 of the semiconductor wafer 303 may be a substrate wafer portion of the semiconductor wafer 303. The etch stop layer structure 315 of the semiconductor wafer 303 may be formed on a first lateral surface of the substrate wafer portion 317 of the semiconductor wafer 303, for example. For example, the etch stop layer structure 315 may be a discontinuous etch stop layer structure extending over at least 70% (or e.g. at least 50%, or e.g. at least 80%) of the lateral area of the semiconductor wafer 303, for example. For example, the etch stop layer structure 315 may include a plurality of etch stop layer portions formed on the first lateral surface of the substrate wafer portion 317 of the semiconductor wafer 303. Additionally, the first semiconductor portion 316 of the semiconductor wafer 303 may be formed on the etch stop layer structure 315 and on at least part of the second semiconductor wafer portion 317. The first semiconductor portion 316 of the semiconductor wafer 303 may be an epitaxial portion of the semiconductor wafer 303. Thus, the etch stop layer structure 315 may be located between the semiconductor wafer portion 317 of the semiconductor wafer 303 and the first semiconductor portion 316 of the semiconductor wafer 303.

The etch stop layer structure 315 of the semiconductor wafer 303 may be an electrically insulating layer (e.g. a silicon dioxide layer), for example.

Optionally or alternatively, the semiconductor wafer 303 may be a silicon-on-insulator (SOI) wafer, for example. Optionally or alternatively, the etch stop layer structure 315 may be (or may include) a buried oxide layer structure. Optionally or alternatively, the etch stop layer structure 315 may be a continuous etch stop layer structure extending over the entire lateral area (or e.g. at least 50%, at least 70%, or e.g. more than 90%, or e.g. more than 95%, or e.g. more than 99% of the lateral area, for example, depending on the material of the mask, e.g. silicon dioxide $SiO_2$, silicon nitride $Si_3N_4$, carbon or aluminum oxide $Al_2O_3$) of the semiconductor wafer 303, for example.

Figure 3B:
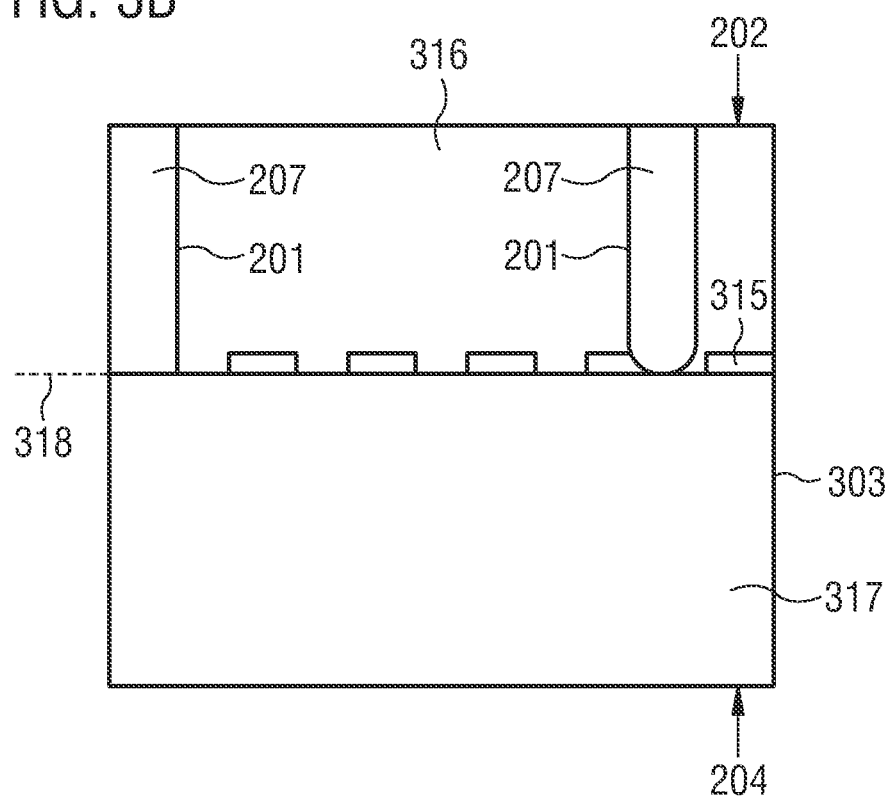

As shown in FIG. 3B, a plurality of trenches 201 comprising the filler material 207 may extend from the first lateral surface 202 of the semiconductor wafer 303 to at least the vertical level 318 (e.g. to the etch stop depth) of the etch stop layer structure 315 of the semiconductor wafer 303. For example, FIG. 3B shows the dicing and filling with the filler material 207 (e.g. C, SiNx, SiO$_2$, or SiC), for example.

The plurality of trenches 201 comprising the filler material 207 may extend from the first lateral surface 202 of the semiconductor wafer 303 to the etch stop depth 318 of the etch stop layer structure 315 or alternatively, deeper into the semiconductor wafer 303 than the etch stop depth 318 of the etch stop layer structure 315. For example, the plurality of trenches 201 comprising the filler material 207 may extend into (or through) at least part of the second semiconductor wafer portion 317 of the semiconductor wafer 303.

Optionally, a first filler material portion (e.g. SiO$_2$) of the filler material may be deposited on the sidewalls of a (or e.g. each) trench of the plurality of trenches before forming the at least one electrical structure 206.

Figure 3C:
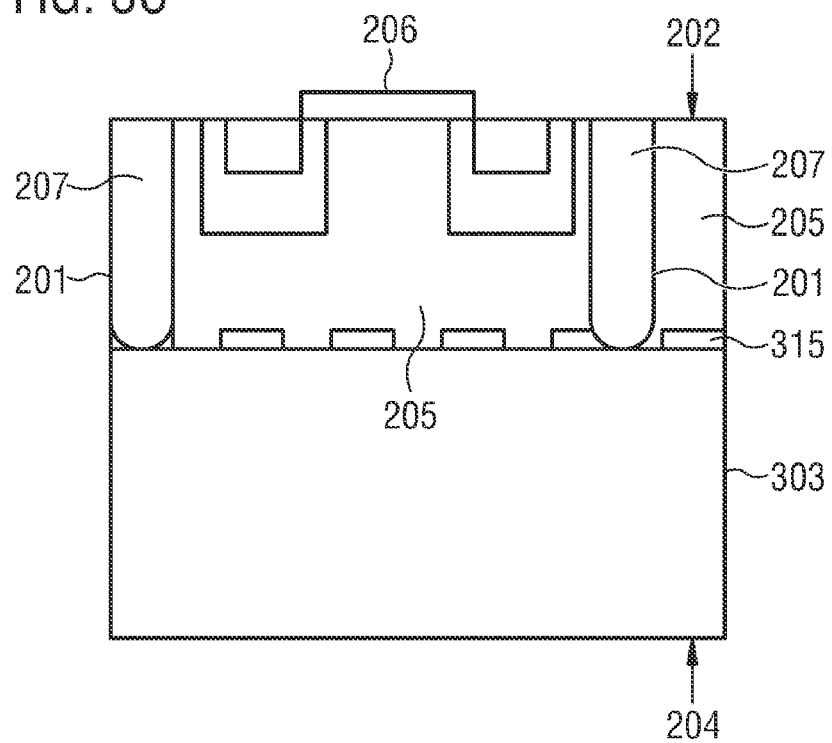

As shown in FIG. 3C, the method 300 may further include forming at least one electrical structure 206 (e.g. FEOL processing, or e.g. device manufacturing) of a semiconductor device in a semiconductor chip region 205 of a plurality of semiconductor chip regions 205 of the semiconductor wafer 303.

Additionally or optionally, the method 300 may include forming (e.g. depositing) a different second filler material portion (e.g. a glue) in the trench between the first filler material portion located in the trench after forming the at least one electrical structure 206. For example, the method 200 may include opening the oxide (e.g. the first filler material portion) and at least partially filling the plurality of trenches 201 with glue.

Figure 3D:
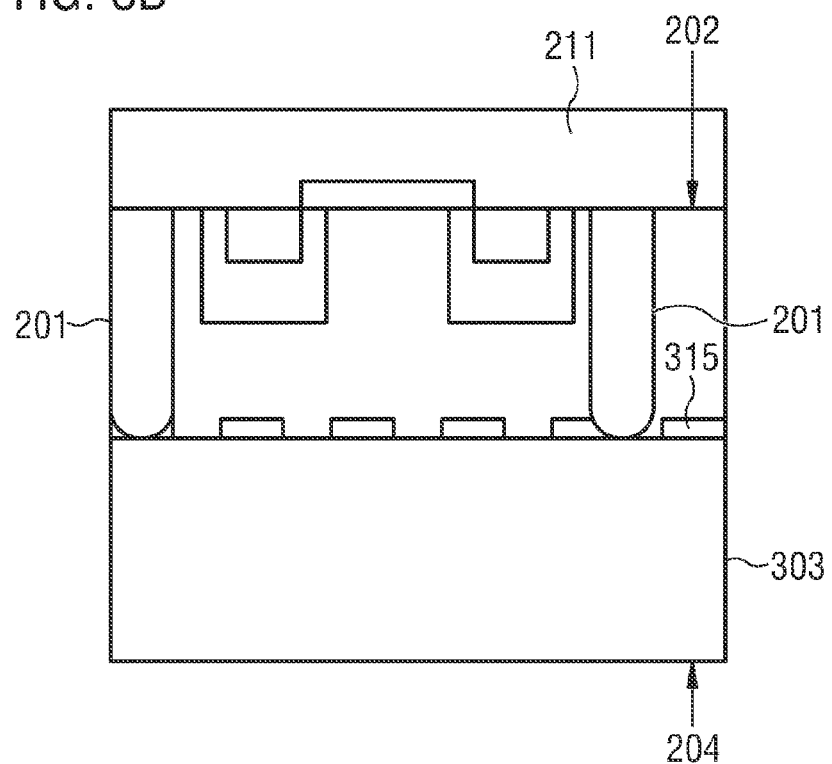

As shown in FIG. 3D, the method 300 may include arranging (or mounting) the semiconductor wafer 303 on a carrier structure 211.

Figure 3E:
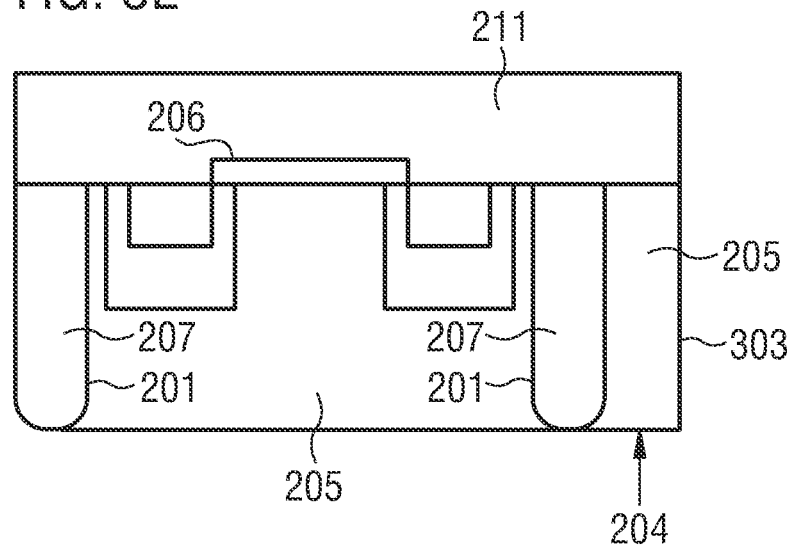

As shown in FIG. 3E, the method 300 may include thinning the semiconductor wafer 303 from the second lateral surface 204 of the semiconductor wafer 303 until the etch stop layer structure of the semiconductor wafer 303 is uncovered at the second lateral surface 204 of the thinned semiconductor wafer 303 (e.g. thinning the semiconductor wafer 303 with an etch stop). Optionally or additionally the plurality of trenches 201 and the etch stop layer structure 315 may be uncovered at the second lateral surface 204 of the thinned semiconductor wafer 303 after thinning the semiconductor wafer 303, for example.

The method 300 may further include removing at least part of the etch stop layer structure of the semiconductor wafer 303 after thinning the semiconductor wafer 303. For example, after (or once, or when) the etch stop layer structure 315 of the semiconductor wafer 303 is uncovered at the second lateral surface 204 of the thinned semiconductor wafer 303, at least part of the etch stop layer structure 315 (e.g. a portion of the etch stop layer structure 315 located on the thinned semiconductor wafer 303 (or on a thinned portion of the semiconductor wafer) may be removed.

Figure 3F:
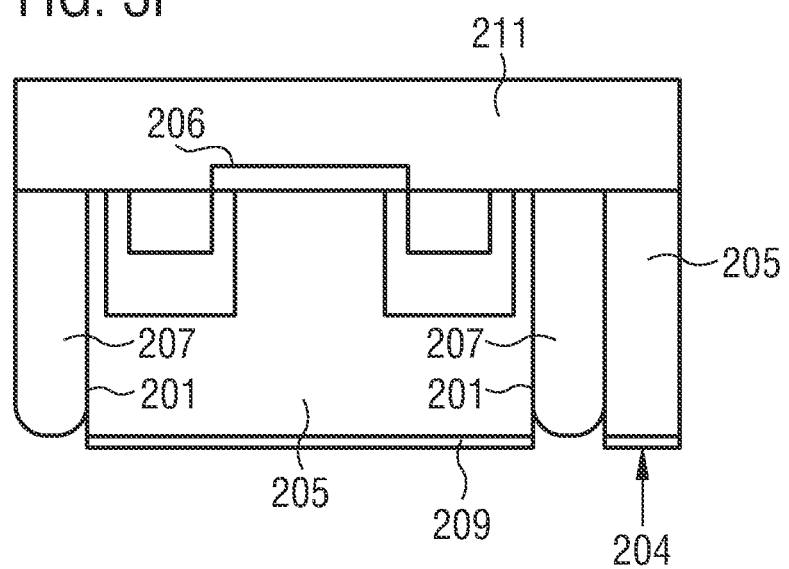

As shown in FIG. 3F, the method 300 may further include forming a back side metallization layer structure 209 on a plurality of semiconductor chip regions 205 of the semiconductor wafer 203 after thinning the semiconductor wafer 203. For example, FIG. 3F shows the back side (BS) processing metallization using (optionally) lithography, for example.

Figure 3G:
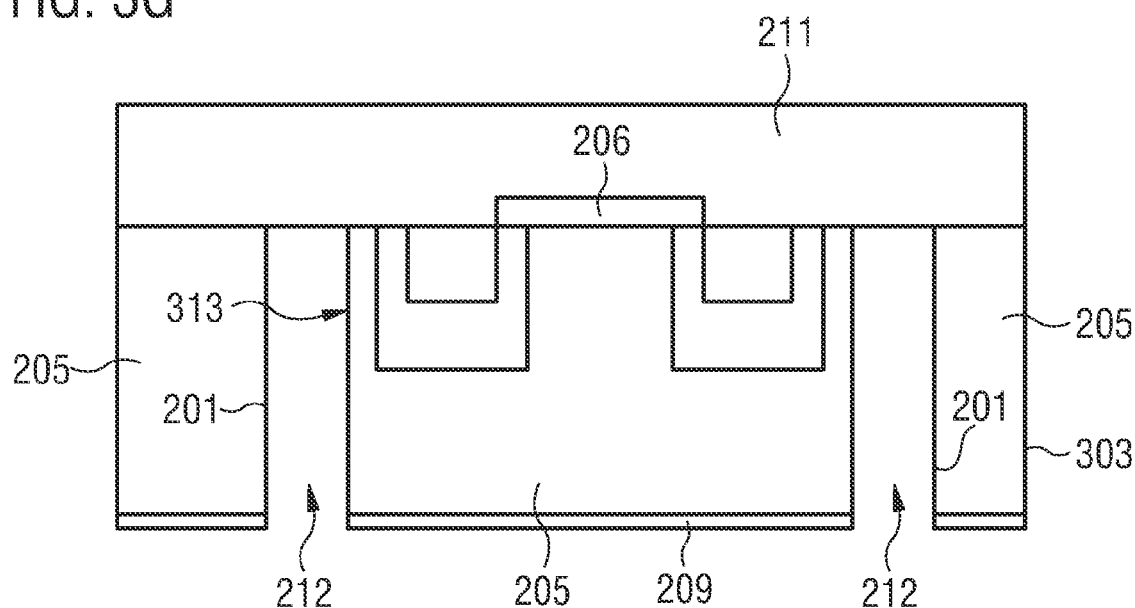

As shown in FIG. 3G, the method 300 may further include individualizing the semiconductor chip regions 205 of the semiconductor wafer 303 by removing at least part of (or e.g. all) the filler material 207 from the plurality of trenches 201 after forming the back side metallization layer structure 209 to obtain the plurality of semiconductor devices. For example, the filler material 207 (e.g. C, SiNx, SiO$_2$, a-SiC, or glue) may be removed from the back side of the semiconductor wafer 303 to separate or individualize the semiconductor chip regions 205 of the semiconductor wafer 303.

Optionally or alternatively, individualizing the semiconductor chip regions of the semiconductor wafer may include modifying the second filler material portion from the plurality of trenches (or e.g. removing, or e.g. expanding, or e.g. breaking, or e.g. tearing the second filler material portion) to separate or individualize each semiconductor chip region from other semiconductor chip regions of the plurality of semiconductor chip regions, for example. The first filler material portion may remain on the vertical edge (or vertical sidewall) of the individualized semiconductor device after modifying the second filler material portion, for example.

After removing at least part of the filler material from the plurality of trenches 201, a separation 212 (e.g. a gap) may be formed between neighboring semiconductor chip regions 205 of the plurality of semiconductor chip regions 205. Thus, each semiconductor chip region 205 may be individualized or separated from other semiconductor chip regions 205 (or e.g. from its neighboring semiconductor chip regions) of the plurality of semiconductor chip regions 205.

Each individualized (or separated) semiconductor device 313 of the plurality of semiconductor devices may include a (or one) semiconductor chip region 205 and the at least one electrical structure 206 formed in the semiconductor chip region 205, for example.

The method 300 may further include removing the plurality of individualized semiconductor devices from the carrier structure 211 after individualizing the semiconductor chip regions 205 of the semiconductor wafer 303, for example.

More details and aspects are mentioned in connection with the embodiments described above or below. The embodiments shown in FIGS. 3A to 3G may each comprise one or more optional additional features corresponding to one or more aspects mentioned in connection with the proposed concept or one or more embodiments described above (e.g. FIGS. 1 to 2G) or below (e.g. FIGS. 4 to 10B).

Figure 4:
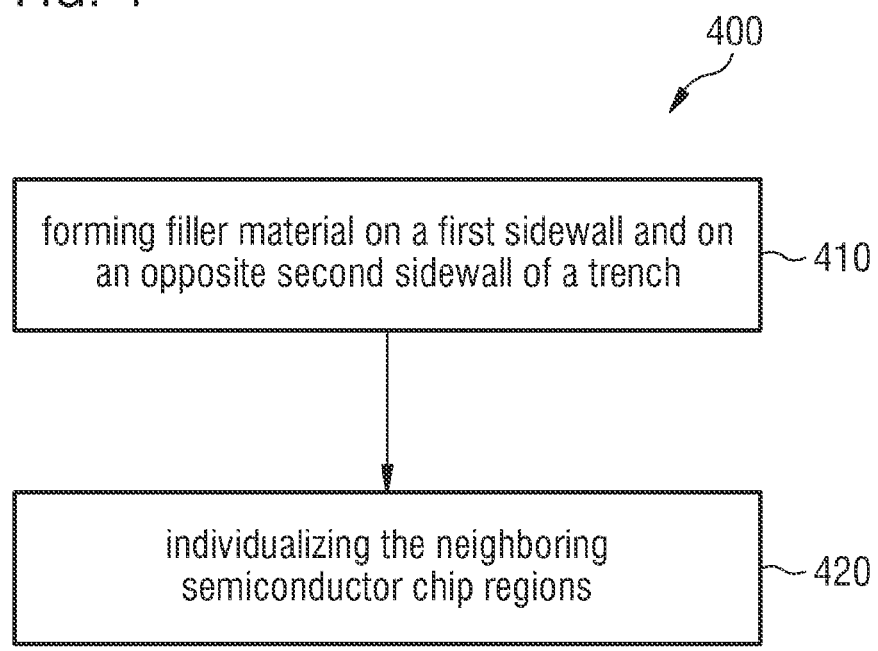
FIG. 4 shows a flow chart of a further method for forming a plurality of semiconductor devices.

FIG. 4 shows a flow chart of a further method 400 for forming a plurality of semiconductor devices.

The method 400 comprises forming 410 filler material on a first sidewall and on an opposite second sidewall of a trench of a plurality of trenches extending from a first lateral surface of a semiconductor wafer towards a second lateral surface of the semiconductor wafer. The trench of the plurality of trenches is located between neighboring semiconductor chip regions of the semiconductor wafer. A trench void remains between the filler material located on the first sidewall of the trench of the plurality of trenches and the filler material located on the second sidewall of the trench of the plurality of trenches.

The method 400 further comprises individualizing 420 the neighboring semiconductor chip regions of the semiconductor wafer by enlarging the distance between the first sidewall of the trench of the plurality of trenches and the second sidewall of the trench of the plurality of trenches.

Due to the enlarging the distance between the first sidewall of the trench of the plurality of trenches and the second sidewall of the trench of the plurality of trenches, processes which affect the front side of the semiconductor wafer and/or which may affect electrical structures located at the front side of the semiconductor wafer may be avoided, for example. Additionally or optionally, by forming 410 the filler material on the first sidewall and on the opposite second sidewall of each trench, the passivated sidewalls may be used as part of the individualized final semiconductor device to be formed or the final semiconductor device package to be formed, for example. Additionally or optionally, the filler material may prevent sidewall metallization of the semiconductor wafer of the individualized semiconductor device during or after a soldering process for soldering the semiconductor device, for example.

The plurality of trenches may extend (substantially) vertically into the semiconductor wafer from the first (or the front) lateral surface of the semiconductor wafer towards the opposite second lateral surface of the semiconductor wafer, for example. A (or one) trench of the plurality of trenches may be located between two neighboring semiconductor chip regions of the semiconductor wafer. For example, each trench of the plurality of trenches may be located between two neighboring semiconductor chip regions of the semiconductor wafer.

Each trench of the plurality of trenches may include substantially vertical sidewalls (e.g. the first sidewall and the second sidewall) extending substantially vertically into the semiconductor substrate and a contact trench bottom connecting the sidewalls of the contact trench, for example. A minimum angle between a sidewall of a trench of the plurality of trenches and the first lateral surface of the semiconductor wafer may be 90° (or e.g. 90°+/−10°, or e.g. 90°+/−5° or e.g. 90°+/−2°), for example. Optionally, the first sidewall and the second sidewall of each trench of the plurality of trenches may be parallel to each other, or may be symmetric about a vertical plane or line of symmetry.

Forming the filler material 410 on the first sidewall and on the opposite second sidewall of a (or each) trench of a plurality of trenches may include depositing the filler material on the first sidewall and on the opposite second sidewall of the trench of the plurality of trenches. Alternatively, filling 120 at least a portion of the plurality of trenches with filler material may include using an oxidation processes (e.g. a thermal oxidation process) to form (or e.g. grow) the filler material on the first sidewall and on the opposite second sidewall of each trench of the plurality of trenches, for example.

Before individualizing 420 the neighboring semiconductor chip regions of the semiconductor wafer, a minimum vertical dimension of the trench void (e.g. an air void) may be at least 20% (or e.g. at least 60%, or e.g. at least 70%, or e.g. at least 80%) of a minimum trench depth of the trench of the plurality of trenches. Additionally or optionally, a minimum lateral dimension of the trench void may be at least 50% (or e.g. at least 60%, or e.g. at least 70%, or e.g. at least 80%) of a lateral width of the trench of the plurality of trenches, for example.

Before individualizing 420 the neighboring semiconductor chip regions of the semiconductor wafer, the trench void located in a (or each) trench may be surrounded or enclosed by the filler material in the trench at the first lateral surface of the semiconductor wafer and at the bottom of the trench, for example. For example, the method 400 may include embedding the trench void between the filler material in the plurality of trenches and closing it on top and bottom with oxide or nitride (to form a plug). For example, at least part of the filler material located on the first sidewall at the first lateral surface of the semiconductor wafer may be directly connected to at least part of the filler material located on the second sidewall at the first lateral surface of the semiconductor wafer forming a plug. Additionally or optionally, at least part of the filler material located on the first sidewall at the bottom of the trench may be directly connected to at least part of the filler material located on the second sidewall at the first lateral surface of the semiconductor wafer at the bottom of the trench forming a plug.

The trenches of the plurality of trenches may never be completely filed during the manufacturing. The trench void may remain after forming the filler material and may exist until the neighboring semiconductor chip regions of the semiconductor wafer are individualized. A trench void may be located in one, some or all trenches of the plurality of trenches and may remain from forming the filler material until the neighboring semiconductor chip regions of the semiconductor wafer are individualized.

Individualizing 420 the neighboring semiconductor chip regions of the semiconductor wafer may include arranging the semiconductor wafer on a stretchable carrier material, and stretching the stretchable carrier material to enlarge the distance between the first sidewall of the trench of the plurality of trenches and the second sidewall of the trench of the plurality of trenches.

For example, individualizing 420 the neighboring semiconductor chip regions of the semiconductor wafer may include laminating the semiconductor wafer to a stretchable tape (e.g. laminating the second lateral surface of the semiconductor wafer) to the stretchable tape and expanding the tape after the tape-lamination to enlarge the distance between the first sidewall of the trench of the plurality of trenches and the second sidewall of the trench of the plurality of trenches. Optionally or additionally, the filler material is not removed from the first sidewall and the second sidewall of the trench. For example, the filler material formed on the first sidewall of the trench may be part of an individualized first semiconductor device. Additionally, the filler material formed on the second sidewall of the trench may be part of an individualized second semiconductor device.

After stretching the stretchable carrier material to enlarge the distance between the first sidewall of the trench of the plurality of trenches and the second sidewall of the trench of the plurality of trenches, the filler material located on the first sidewall and the filler material located on the second sidewall may be separated from each other. For example, any parts of the filler material located on the first sidewall which were directly connected to parts of the filler material located on the second sidewall (e.g. at the first lateral surface of the semiconductor wafer and/or at the bottom of the trench) before individualizing 420 the neighboring semiconductor chip regions of the semiconductor wafer may be disconnected or separated from each other after individualizing 420 the neighboring semiconductor chip regions of the semiconductor wafer.

Optionally or alternatively, individualizing 420 (e.g. separating) the neighboring semiconductor chip regions of the semiconductor wafer may include removing at least part of the filler material from the trench of the plurality of trenches. For example, the method may include removing at least part of the filler material located in the trench of the plurality of trenches to separate the neighboring semiconductor chip regions by a dry (or plasma etch) from the second lateral surface (e.g. back side) of the semiconductor wafer. Thus the front side of the semiconductor wafer is not affected and contamination may be prevented, for example. Optionally, individualizing 420 the neighboring semiconductor chip regions of the semiconductor wafer may include removing at least part of the filler material from the trench of the plurality of trenches and enlarging the distance between the first sidewall of the trench of the plurality of trenches and the second sidewall of the trench of the plurality of trenches after removing at least part of the filler material.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1 to 3G) or below (e.g. FIGS. 5A to 10B).

Figure 5A:
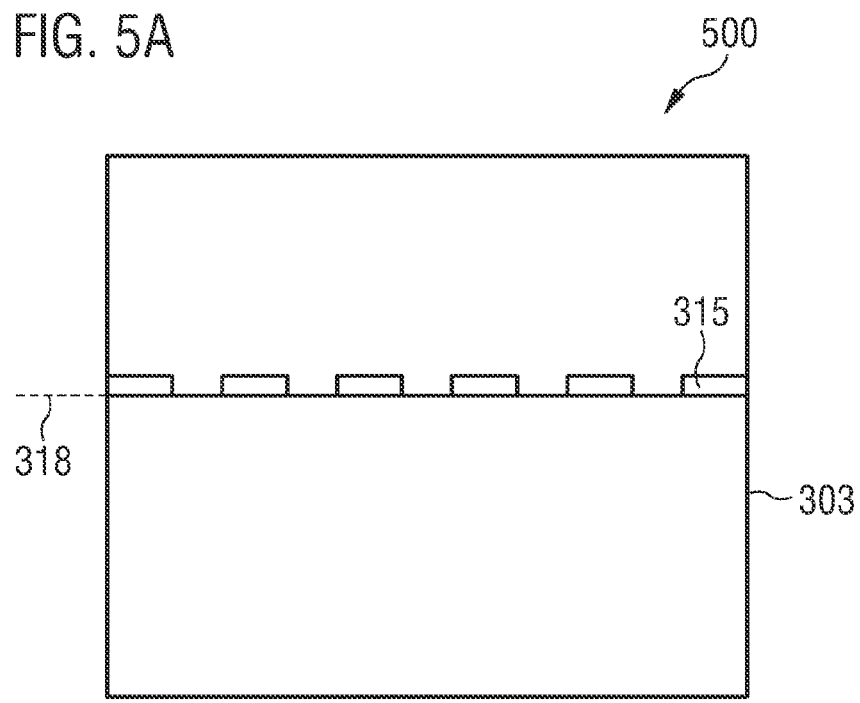
FIGS. 5A to 5C show schematic illustrations of a method for forming a plurality of semiconductor devices by using a trench void.
Figure 5B:
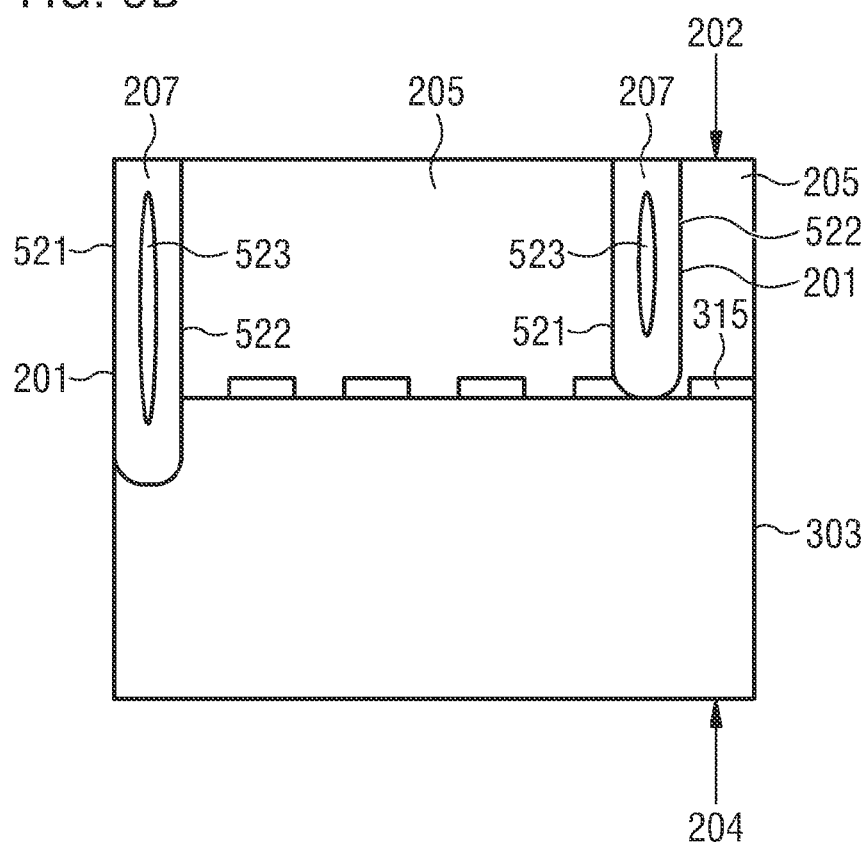
Figure 5C:
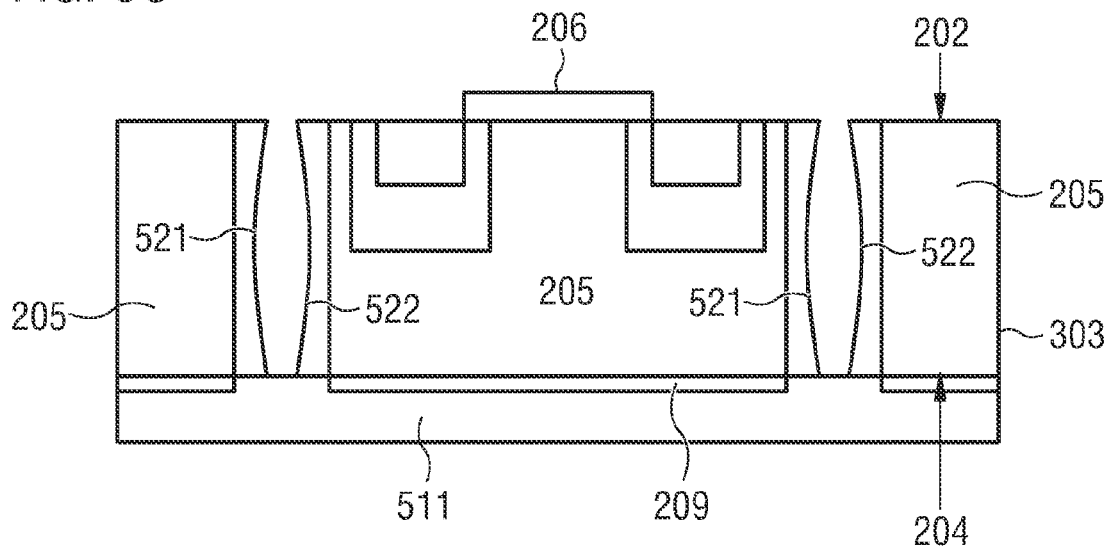

FIGS. 5A to 5C show schematic illustrations of a method 500 for forming a plurality of semiconductor devices. Each of FIGS. 5A to 5C shows a two-dimensional view of at least part of a semiconductor wafer at a cross-section extending vertically through the semiconductor wafer. For example, FIGS. 5A to 5C show a trench filler with a (trench) void, or trenches with empty bubbles, for example.

The method 500 described in connection with FIGS. 5A to 5C may include one or more or all of the features of the method described in connection with FIG. 4, for example.

As shown in FIG. 5A, the semiconductor wafer 303 may include an etch stop layer structure 315 of the semiconductor wafer 303 at an etch stop depth (or level) 318 (e.g. the semiconductor wafer 303 may include a buried oxide or SOI). Alternatively, the semiconductor wafer may not have an etch stop layer structure.

As shown in FIG. 5B, the method 500 may include forming a plurality of trenches 201 extending from the first lateral surface 202 of the semiconductor wafer 303 towards the second lateral surface 204 of the semiconductor wafer 303. The method 500 may include forming filler material 207 on a first sidewall 521 of a trench 201 of the plurality of trenches 201 and on an opposite second sidewall 522 of the trench 201 of the plurality of trenches 201. For example, FIG. 5B shows the dicing and filling with a filler material 207 (e.g. C, SiNx, SiO$_2$, or SiC), for example. The filler material 207 may be deposited on the first sidewall 521 and the second sidewall 522 of the trench 201 to form a conformal passivation, for example.

A (or each) trench 201 of the plurality of trenches 201 may be located between neighboring semiconductor chip regions 205 of the semiconductor wafer 303, for example.

A trench void 523 may remain (or may be located) between the filler material 207 located on the first sidewall 521 of the trench 201 of the plurality of trenches 201 and the filler material 207 located on the second sidewall 522 of the trench 201 of the plurality of trenches 201.

The plurality of trenches 201 comprising the filler material 207 may extend from the first lateral surface 202 of the semiconductor wafer 303 to the etch stop depth 318 of the etch stop layer structure 315. Alternatively, the plurality of trenches 201 comprising the filler material 207 may extend deeper into the semiconductor wafer 303 than the etch stop depth 318 of the etch stop layer structure 315.

As shown in FIG. 5B, the filling (filler) material 207 may include an isolation layer (e.g. oxide or nitride) on the sidewalls of the trench 201 and at the top and bottom of the trench 201 and a trench void. In this case the removal of the material is not necessary and chip separation may be carried out after tape lamination by expanding the tape, for example.

As shown in FIG. 5C, the method 500 may further include forming at least part of at least one electrical structure 206 of a semiconductor device in a semiconductor chip region 205 of the semiconductor wafer 303 after forming the filler material 207 in the plurality of trenches 201.

The method 500 may further include thinning the semiconductor wafer 303 from the second lateral surface 204 of the semiconductor wafer 303 to form a thinned semiconductor wafer 303 after forming at least part of the at least one electrical structure 206 of the semiconductor device.

The method 500 may further include forming a back side metallization layer structure 209 on the plurality of semiconductor chip regions 205 of the semiconductor wafer 203 after thinning the semiconductor wafer 303, for example.

The method 500 may further include arranging (or mounting) the semiconductor wafer 303 on a carrier structure 511 (which may be a stretchable carrier material) after forming the back side metallization layer structure 209.

In case of FIG. 5B to FIG. 5C no filler material may be removed. The chips may be separated by extension of the underlying foil.

Additionally or optionally, the method 500 may include one or more or all of the features of the methods described in connection with FIGS. 1 to 4 before individualizing the neighboring semiconductor chip regions 205 of the semiconductor wafer 303.

The method 500 may include individualizing the neighboring semiconductor chip regions 205 of the semiconductor wafer 303 by enlarging the distance between the first sidewall 521 of the trench 201 of the plurality of trenches 201 and the second sidewall 522 of the trench 201 of the plurality of trenches 201. For example, individualizing the neighboring semiconductor chip regions 205 of the semiconductor wafer 303 may include arranging the semiconductor wafer 303 on the stretchable carrier material 511, and stretching the stretchable carrier material 511 to enlarge the distance between the first sidewall 521 of the trench 201 of the plurality of trenches 201 and the second sidewall 522 of the trench 201 of the plurality of trenches 201. For example, individualizing 420 the neighboring semiconductor chip regions of the semiconductor wafer may include laminating the semiconductor wafer to a stretchable carrier material (or foil) 511 (e.g. laminating the second lateral surface 204 of the semiconductor wafer 303 to the stretchable carrier material 511) and expanding the stretchable carrier material 511 after the tape-lamination to enlarge the distance between the first sidewall 521 of the trench 201 of the plurality of trenches 201 and the second sidewall 522 of the trench 201 of the plurality of trenches 201.

The method described in connection with FIGS. 5A to 5C may provide a realization of ultra-thin power technologies down to 5 µm (or 3.5 µm), e.g. in the range of 2 to 5 µm or e.g. also in the range of 1 to 10 µm, depending on the voltage class, and may provide a significant cost down improvement, for example.

More details and aspects are mentioned in connection with the embodiments described above or below. The embodiments shown in FIGS. 5A to 5C may each comprise one or more optional additional features corresponding to one or more aspects mentioned in connection with the proposed concept or one or more embodiments described above (e.g. FIGS. 1 to 4) or below (e.g. FIGS. 6 to 10E).

Figure 6:
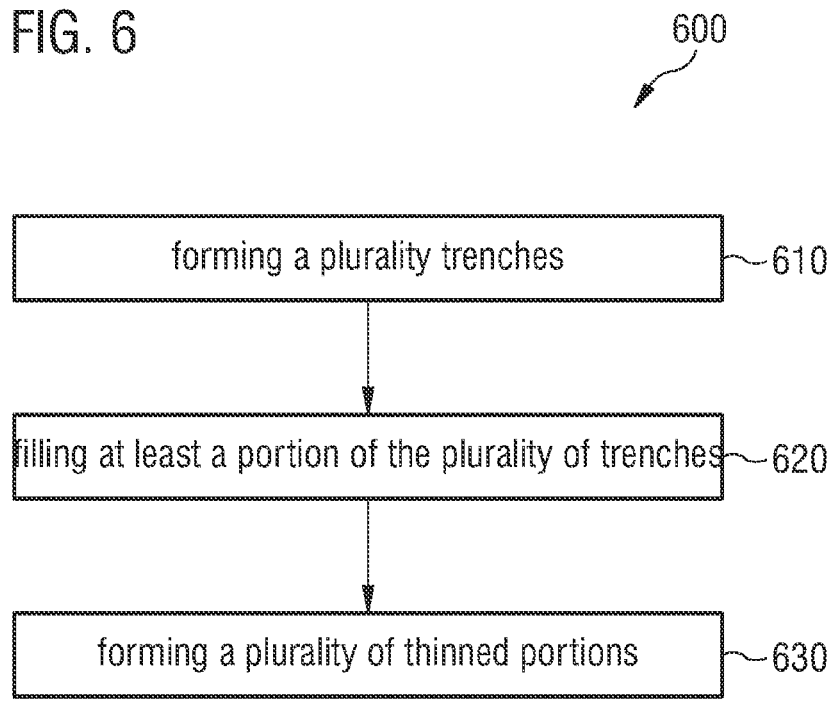
FIG. 6 shows a flow chart of a further method for forming a plurality of semiconductor devices.

FIG. 6 shows a flow chart of a further method 600 for forming a plurality of semiconductor devices.

The method 600 comprises forming 610 a plurality of trenches extending from a first lateral surface of a semiconductor wafer towards a second lateral surface of the semiconductor wafer.

The method 600 further comprises filling 620 at least a portion of the plurality of trenches with filler material.

The method 600 further comprises forming 630 thinned portions of a plurality of semiconductor chip regions of the semiconductor wafer by thinning portions of the semiconductor wafer between neighboring trenches of the plurality of trenches from the second lateral surface of the semiconductor wafer to a first thickness. Each semiconductor chip region of the plurality of semiconductor chip regions comprises an edge portion located at an edge of the semiconductor chip region after forming the plurality of thinned portions of the plurality of semiconductor chip regions. Each edge portion of the semiconductor chip region has a second thickness. The second thickness is larger than the first thickness.

Due to each semiconductor chip region of the plurality of semiconductor chip regions comprising an edge portion having a second thickness larger than a first thickness of the thinned portion, each semiconductor device to be formed may have improved stabilization. Additionally or optionally, after forming 530 the thinned portions of a plurality of semiconductor chip regions of the semiconductor wafer, the semiconductor wafer may have improved stabilization, for example.

The method boo may include forming 630 the thinned portions of a plurality of semiconductor chip regions the semiconductor wafer by grinding and/or etching portions of the semiconductor wafer between neighboring trenches of the plurality of trenches from the second lateral surface of the semiconductor wafer. After thinning the portions of the semiconductor wafer between the neighboring trenches of the plurality of trenches, each thinned portion may have the first thickness. A maximum thickness of the thinned portions of the plurality of semiconductor chip regions wafer after thinning the portions of the semiconductor wafer may lie between 4 µm and 200 µm (or e.g. between 4 µm and 100 µm, or e.g. between 4 µm and 40 µm), for example. The thickness of a thinned portion of the semiconductor wafer may be a dimension or distance measured substantially vertically from the first lateral surface of the semiconductor wafer to the second lateral surface of the thinned portion of the semiconductor wafer, for example.

Some portions of the semiconductor wafer are not thinned during the forming 630 of the thinned portions of the plurality of semiconductor chip regions the semiconductor wafer. For example, the portions of the semiconductor wafer which are not thinned may be a plurality of edge portions of the plurality of semiconductor chip regions. Each semiconductor chip region of the plurality of semiconductor chip regions comprises an edge portion located at an edge of the semiconductor chip region after forming the plurality of thinned portions of the plurality of semiconductor chip regions. An edge portion of a semiconductor chip region may laterally surround the thinned portion of a semiconductor chip region in a top (or bottom) view cross-section of the semiconductor wafer, for example. Each edge portion may be formed between at least two neighboring semiconductor chip regions, for example. The edge portions of the plurality of semiconductor chip regions may be part of the semiconductor wafer and may comprise or may consist of semiconductor material.

The minimum (or smallest) thickness of the edge portion (e.g. the second thickness) may be a dimension or distance measured substantially vertically from the first lateral surface of the semiconductor wafer to the second lateral surface of the edge portion of the semiconductor wafer, for example. The minimum thickness of the edge portion of the semiconductor chip region may be at least 1.2 times (or e.g. at least 1.5 times, or e.g. at least 2 times, or e.g. at least 4 times, or e.g. at least 5 times) thicker than the maximum (or largest) first thickness of the thinned portion of the semiconductor chip region, for example. For example, the minimum (or smallest) thickness of the edge portion (e.g. the second thickness) may lie between 6 µm and 150 µm (or e.g. between 50 µm and 85 µm, or e.g. between 50 µm and 70 µm), for example.

A maximum (or largest) lateral width of an (or e.g. one, or e.g. each) edge portion of a semiconductor chip region may lie between 1% and 25% (or e.g. between 5% and 20%, or e.g. between 5% and 15%) of a minimum (or smallest) lateral width of the semiconductor chip region, for example. For example, the maximum lateral width of the edge portion of a semiconductor chip region may lie between 500 nm and 50 µm (or e.g. between 2 µm and 70 µm, between 5 µm and 50 µm, between 10 µm and 30 µm, or e.g. between 10 µm and 20 µm), for example. The maximum lateral width of the edge portion of the semiconductor chip region may be a lateral dimension of the edge portion measured in the second lateral direction at the vertical level of the second lateral surface of the thinned portion of the semiconductor wafer, for example.

Optionally, the edge portion of a semiconductor chip region may include substantially vertical sidewalls (e.g. a first substantially vertical sidewall and a second substantially vertical sidewall). For example, a vertical sidewall of the edge portion may be located (directly) adjacent to a back side metallization layer structure to be formed on the thinned portion of the semiconductor chip region.

Optionally or alternatively, the edge portion of a semiconductor chip region may include at least one beveled sidewall. For example, the edge portion of the semiconductor chip region may include a substantially vertical sidewall located (directly) adjacent to a trench comprising the filter material. Additionally, the edge portion of the semiconductor chip region may include an opposite beveled sidewall. For example, the beveled sidewall of the semiconductor chip region may be located between the back side metallization layer structure and an edge of the semiconductor substrate. For example, the beveled sidewall of the semiconductor chip region may be located (directly) adjacent to the back side metallization layer structure to be formed on the thinned portion of the semiconductor chip region.

Optionally, the plurality of trenches comprising the filler material may extend deeper into the semiconductor wafer than the first thickness of the thinned portions of the semiconductor wafer after forming 630 the thinned portions. For example, at least part of a (or e.g. one) trench of the plurality of trenches may be located between neighboring edge portions of the plurality of edge portions of the plurality of semiconductor chip regions. For example, at least part of a (or e.g. one) trench may be located between an edge portion of a first semiconductor chip region and an edge portion of a neighboring semiconductor chip region, for example.

Optionally, the method 600 may further include forming a back side metallization layer structure on the thinned portions of the plurality of semiconductor chip regions after forming the plurality of thinned portions. Thus, the edge portion of a semiconductor chip region may laterally surround the back side metallization layer structure formed on a thinned portion of the semiconductor chip region.

Optionally, the method 600 may further include individualizing the semiconductor chip regions of the semiconductor wafer by removing at least part of the filler material from the plurality of trenches after forming the thinned portions of the plurality of semiconductor chip regions. For example, individualizing the semiconductor chip regions of the semiconductor wafer may be carried out after forming the back side metallization layer structure on the thinned portions of the plurality of semiconductor chip regions.

More details and aspects are mentioned in connection with the embodiments described above or below. The embodiments shown in FIG. 6 may comprise one or more optional additional features corresponding to one or more aspects mentioned in connection with the proposed concept or one or more embodiments described above (e.g. FIGS. 1 to 5C) or below (e.g. FIGS. 7A to 10B).

FIGS. 7A to 7F show schematic illustrations of a method 700 for forming a plurality of semiconductor devices. Each of FIGS. 7A to 7F shows a two-dimensional view of at least part of a semiconductor wafer at a cross-section extending vertically through the semiconductor wafer. For example, FIGS. 7A to 7F show a process flow with chip TAIKO as mechanical support or stabilization and a buried oxide, for example.

The method 700 described in connection with FIGS. 7A to 7G may include one or more or all of the features of the method described in connection with FIGS. 1 to 6, for example.

Figure 7A:
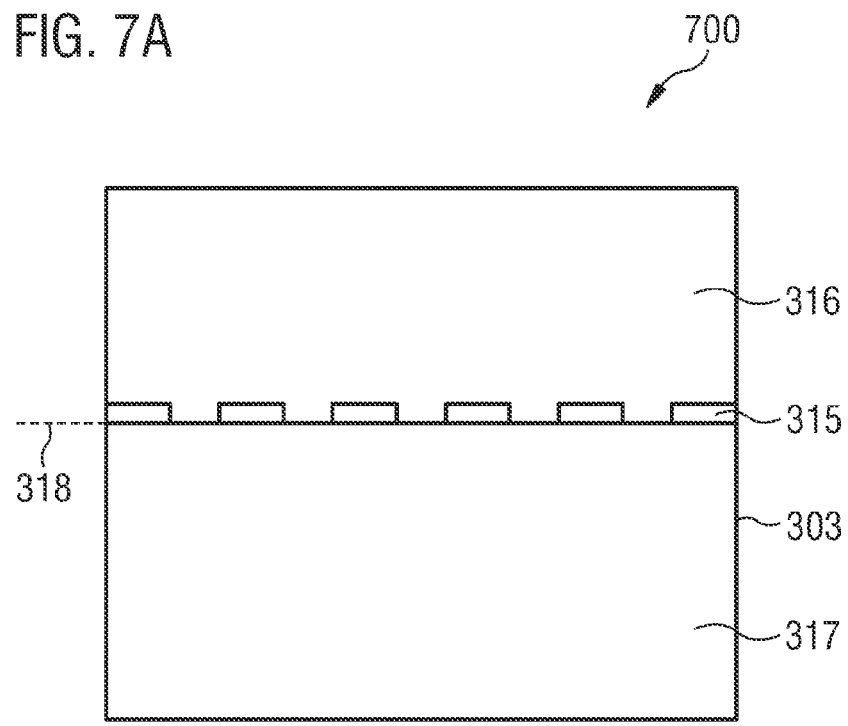
FIGS. 7A to 7F show schematic illustrations of a method for forming a plurality of semiconductor devices comprising an edge portion.

As shown in FIG. 7A, the semiconductor wafer 303 may include an etch stop layer structure 315. For example, the etch stop layer structure 315 of the semiconductor wafer 303 may be a buried etch stop layer structure located (vertically) between a first semiconductor portion 316 of the semiconductor wafer 303 and a second semiconductor portion 317 of the semiconductor wafer 303 at an etch stop depth (or level) 318. For example, the semiconductor wafer 303 may be a substrate with a buried oxide or SOI and an epitaxial portion.

Figure 7B:
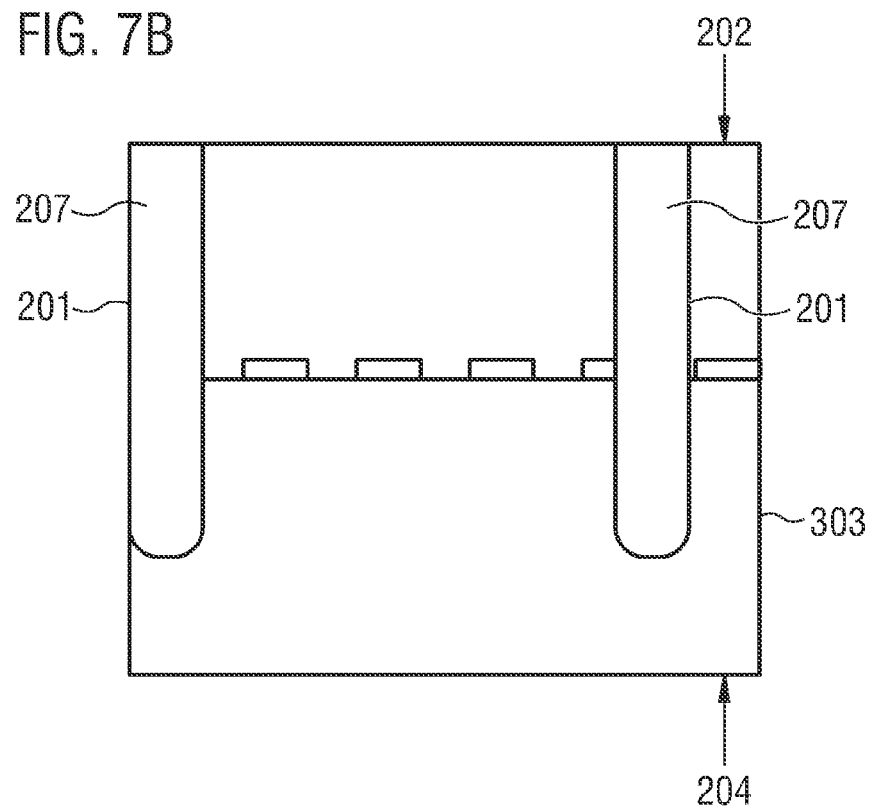

As shown in FIG. 7B, a plurality of trenches 201 comprising filler material 207 may extend from the first lateral surface 202 of the semiconductor wafer 303 to at least the vertical level 318 (e.g. to the etch stop depth) of the etch stop layer structure 315 of the semiconductor wafer 303. For example, the plurality of trenches comprising the filler material 207 may extend deeper into the semiconductor wafer 303 than the etch stop depth 318 of the etch stop layer structure 315. For example, the plurality of trenches 201 comprising the filler material 207 may extend into (or through) the second semiconductor wafer portion 317 of the semiconductor wafer 303. For example, FIG. 7B shows the dicing and filling with a filler material 207 (e.g. C, SiNx, SiO$_2$, or SiC), for example.

Figure 7C:
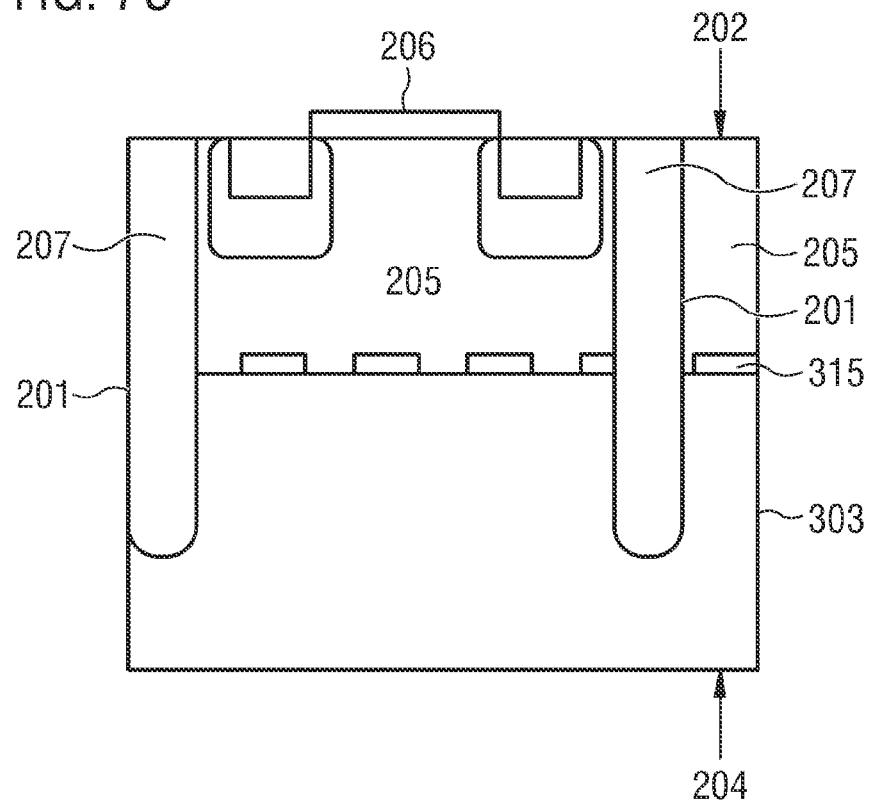

As shown in FIG. 7C, the method 700 may further include forming at least one electrical structure 206 of a semiconductor device in a semiconductor chip region 205 of a plurality of semiconductor chip regions 205 of the semiconductor wafer 303 (e.g. FEOL processing, or e.g. device manufacturing).

Figure 7D:
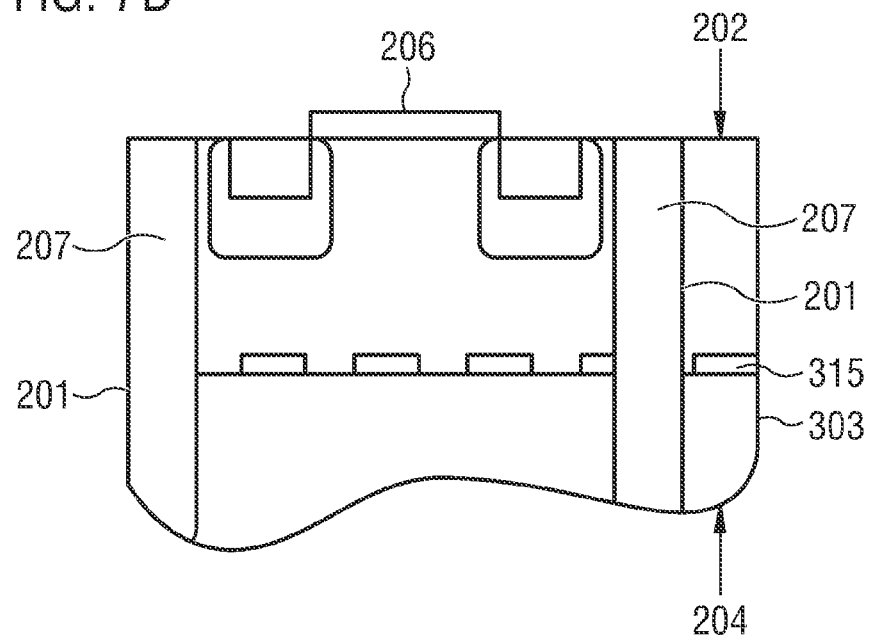

As shown in FIG. 7D, the method 700 may include thinning the semiconductor wafer 303 from the second lateral surface 204 of the semiconductor wafer 303. Thinning the semiconductor wafer may include grinding the semiconductor wafer at (or from) the second lateral surface of the semiconductor wafer. The grinding of the semiconductor wafer may reduce a thickness of the semiconductor wafer to at least 50% (or e.g. at least 40%) of the thickness of the semiconductor wafer before thinning the semiconductor wafer.

Figure 7E:
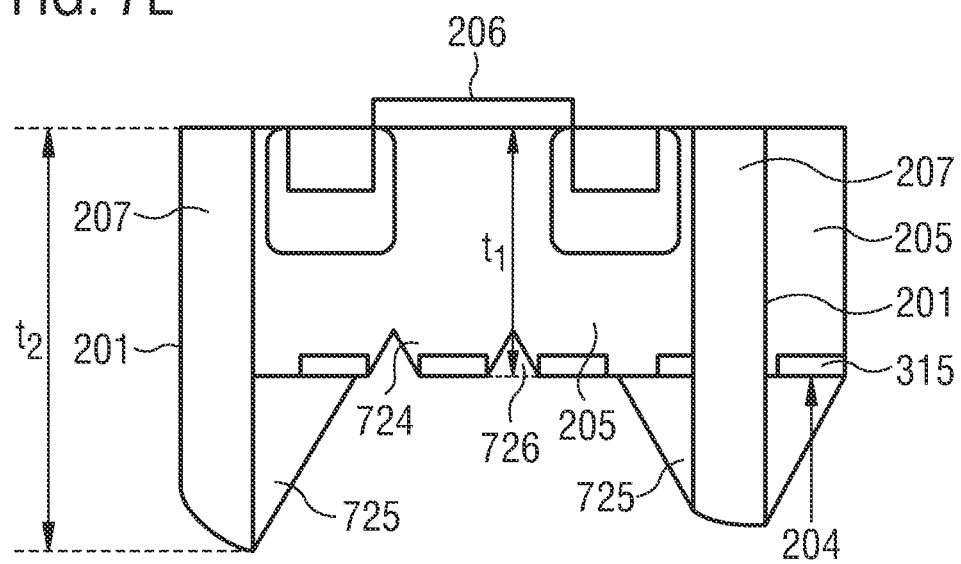

As shown in FIG. 7E, thinning the semiconductor wafer 303 may further include forming a plurality of thinned portions 724 of a plurality of semiconductor chip regions of the semiconductor wafer 303 by thinning (e.g. selectively etching) portions 724 of the semiconductor wafer 303 between neighboring trenches 201 of the plurality of trenches 201 from the second lateral surface 204 of the semiconductor wafer 303 to a first thickness, t1. Optionally, the first thickness of a thinned portion 724 of a semiconductor chip region 205 after thinning the semiconductor wafer 303 may be substantially equal to (or e.g. may lie within +/−10%, or e.g. within +/−5%, or +/−1% of) the etch stop depth of the etch stop layer structure 315 of the semiconductor wafer 303, for example. For example, FIG. 7E shows forming the plurality of thinned portions 724 using backside (BS) lithography to form a chip TAIKO.

Forming the plurality of thinned portions 724 of the plurality of semiconductor chip regions of the semiconductor wafer 303 may include thinning portions 724 of the semiconductor wafer 303 between the neighboring trenches 201 of the plurality of trenches 201 until the etch stop layer structure 315 of the semiconductor wafer 303 is uncovered at the second lateral surface 204 of the thinned portions 724 of the semiconductor wafer 303 between the neighboring trenches 201 of the plurality of trenches 201. For example, the plurality of thinned portions 724 may be formed by etching with an etch stop on the buried oxide (e.g. the etch stop layer structure 315).

After thinning the semiconductor wafer 303 by etching with an etch stop on a discontinuous (or fragmented) etch stop layer structure 315, one or more grooves 726 may be formed at the second lateral surface 204 of each thinned portions 724 of the plurality of thinned portions 724 of the semiconductor wafer 303, for example. The grooves 726 may be located laterally between the etch stop layer portions of the discontinuous etch stop layer structure 315, for example.

After thinning the semiconductor wafer 303 to form the plurality of thinned portions 724 of the plurality of semiconductor chip regions 205, each semiconductor chip region 205 of the plurality of semiconductor chip regions 205 may include an edge portion 725 (chip TAIKO ring) located at an edge of the semiconductor chip region 205 after forming the plurality of thinned portions of the plurality of semiconductor chip regions. Each edge portion 725 of the semiconductor chip region 205 may have the second thickness, t2, which may be larger than the first thickness, t1, for example. Each edge portion 725 of the semiconductor chip region 205 may include a beveled (or tapered) or sidewall, or may be without a beveled (or tapered) sidewall, for example.

Figure 7F:
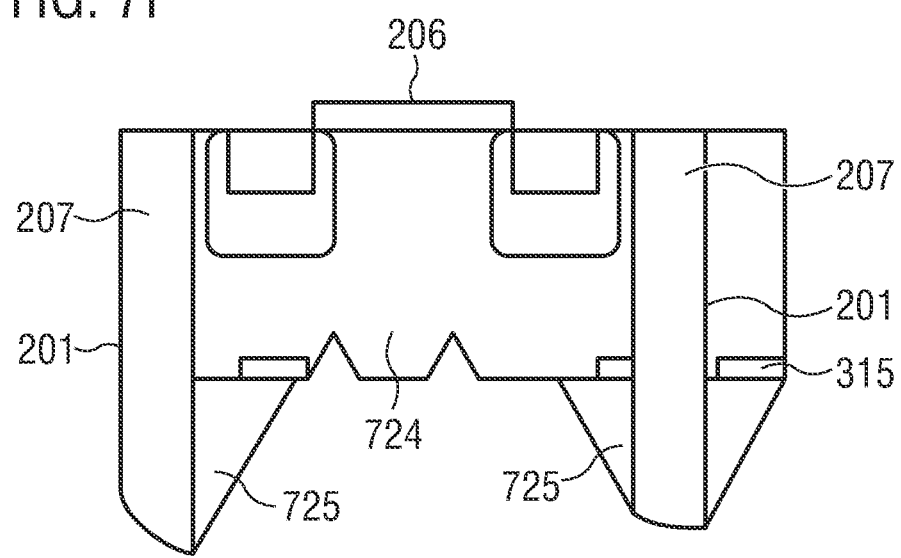

As shown in FIG. 7F, the method 700 may further include removing portions of the etch stop layer structure 315 (removing the buried oxide) of the semiconductor wafer 303 uncovered at the second lateral surface 204 of the thinned portions 724 of the semiconductor wafer 303. The portions of the etch stop layer structure 315 may be removed using hydrofluoric acid (HF), such as by dipping the semiconductor wafer in HF, for example.

Additionally or optionally, the method 700 may further include forming a back side metallization layer structure on the thinned portions 724 of the plurality of semiconductor chip regions 205 after forming the plurality of thinned portions 724. Thus, the edge portion 725 of a semiconductor chip region 205 may laterally surround the back side metallization layer structure formed on a thinned portion 724 of the semiconductor chip region 205, for example. Portions of the etch stop layer structure 315 of the semiconductor wafer 303 located at the thinned portions 724 of the semiconductor wafer between the neighboring trenches 201 of the plurality of trenches 201 may be removed before forming the back side metallization layer structure on the thinned portions 724 of the plurality of semiconductor chip regions 205, for example.

Optionally, the method 700 may further include individualizing the semiconductor chip regions 205 of the semiconductor wafer 303 by removing at least part of the filler material 207 from the plurality of trenches 201 after forming the thinned portions 724 of the plurality of semiconductor chip regions 205. For example, individualizing the semiconductor chip regions 205 of the semiconductor wafer 303 may be carried out after forming the back side metallization layer structure on the thinned portions 724 of the plurality of semiconductor chip regions 205.

More details and aspects are mentioned in connection with the embodiments described above or below. The embodiments shown in FIGS. 7A to 7F may each comprise one or more optional additional features corresponding to one or more aspects mentioned in connection with the proposed concept or one or more embodiments described above (e.g. FIGS. 1 to 6) or below (e.g. FIGS. 8A to 10B).

Figure 8A:
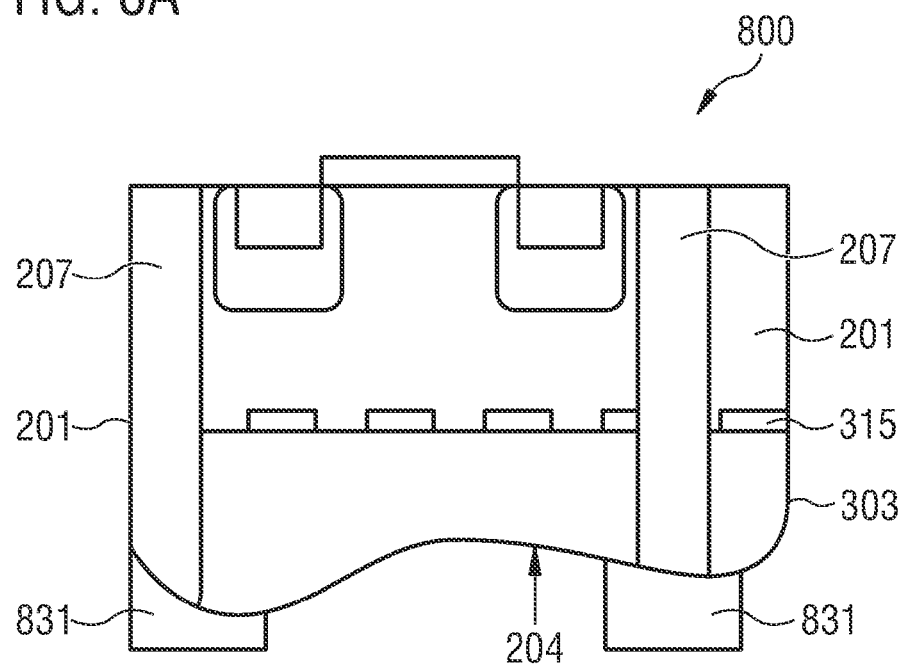
FIGS. 8A to 8C show schematic illustrations of a method for forming a plurality of semiconductor devices using photolithography.
Figure 8B:
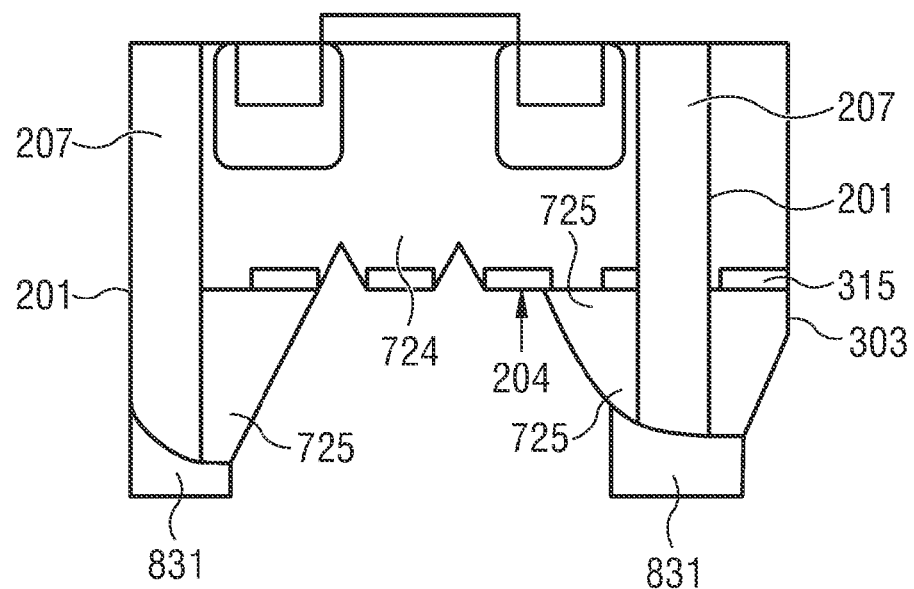
Figure 8C:
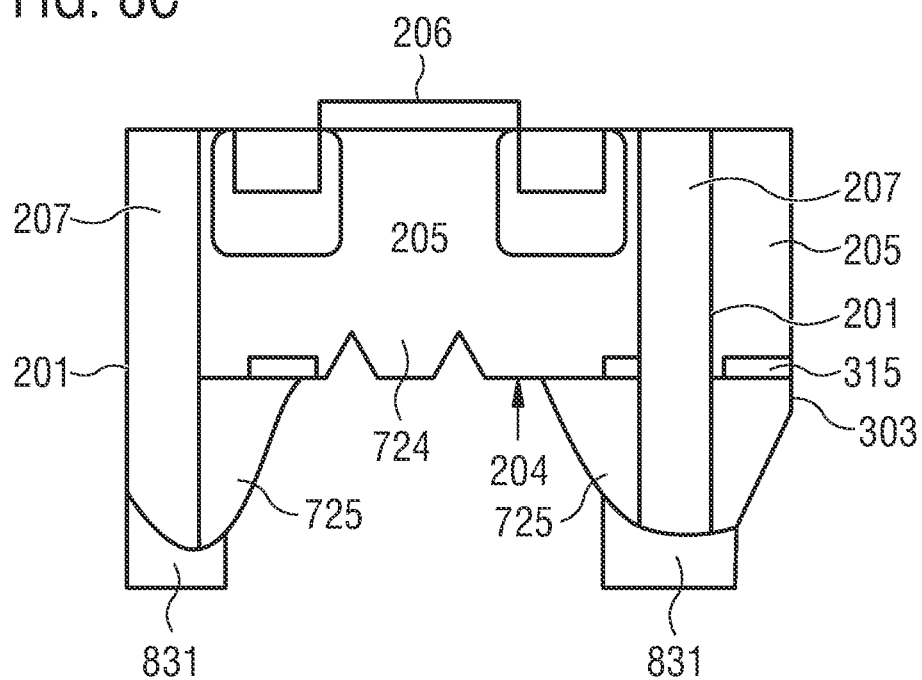

FIGS. 8A to 8C show schematic illustrations of a method 800 for forming a plurality of semiconductor devices. Each of FIGS. 8A to 8C shows a two-dimensional view of at least part of a semiconductor wafer at a cross-section extending vertically through the semiconductor wafer.

The method 800 described in connection with FIGS. 8A to 8C may include one or more or all of the features of the method described in connection with FIGS. 7A to 7F, for example.

As shown in FIG. 8A, the method 800 may include forming a photolithographic mask 831 at the second lateral surface of the semiconductor wafer 303 after grinding the semiconductor wafer at (or from) the second lateral surface of the semiconductor wafer 303.

As shown in FIG. 8B, the method 800 may include forming a photolithographic mask 831 before thinning (e.g. etching) the portions 724 of the semiconductor wafer 303 between neighboring trenches 201 of the plurality of trenches 201 from the second lateral surface 204 of the semiconductor wafer 303 to the first thickness, t1.

The photolithographic mask 831 may cover the plurality of trenches 201 at the second lateral surface between neighboring edge portions of the plurality of edge portions 725 of the plurality of semiconductor chip regions 205. Using lithography, the thinned portions 724 of the semiconductor wafer 303 may be uncovered (e.g. not covered) by the photolithographic mask, for example.

Each edge portion 725 of the semiconductor chip region 205 may include a beveled (or tapered) or sidewall, or may be without a beveled (or tapered) sidewall, for example.

As shown in FIG. 8C, the method 800 may include removing (e.g. selective etching) portions of the etch stop layer structure 315 of the semiconductor wafer 303 uncovered at the second lateral surface 204 of the thinned portions 724 of the semiconductor wafer 303. The photolithographic mask 831 may prevent the filler material 207 from being removed (or etched) during the removing of the portions of the etch stop layer structure 315, for example. The portions of the etch stop layer structure 315 may be removed using hydrofluoric acid (HF), such as by dipping the semiconductor wafer in HF, for example.

Optionally, or additionally, the method 800 may further include forming a back side metallization layer structure on the thinned portions 724 of the plurality of semiconductor chip regions 205 after removing of the portions of the etch stop layer structure 315, for example. Thus, the back side metallization layer structure may be formed (or e.g. deposited) on the thinned portions 724 of the plurality of semiconductor chip regions 205 of the semiconductor wafer and/or on at least part of the edge portions 725 not covered by the photolithographic mask 831, for example. For example, the back side metallization layer structure may be formed at the second lateral surface 204 of the thinned portions 724 of the semiconductor wafer, for example.

Optionally, the method 800 may further include removing the photolithographic mask 831 from the second lateral surface 204 of the semiconductor wafer 303 after forming the back side metallization layer structure.

Optionally, the method 800 may further include individualizing the semiconductor chip regions 205 of the semiconductor wafer 303 by removing at least part of the filler material 207 from the plurality of trenches 201 after forming the thinned portions 724 of the plurality of semiconductor chip regions 205. For example, individualizing the semiconductor chip regions 205 of the semiconductor wafer 303 may be carried out after forming the back side metallization layer structure on the thinned portions 724 of the plurality of semiconductor chip regions 205.

More details and aspects are mentioned in connection with the embodiments described above or below. The embodiments shown in FIGS. 8A to 8C may each comprise one or more optional additional features corresponding to one or more aspects mentioned in connection with the proposed concept or one or more embodiments described above (e.g. FIGS. 1 to 7F) or below (e.g. FIGS. 9 to 10B).

Figure 9:
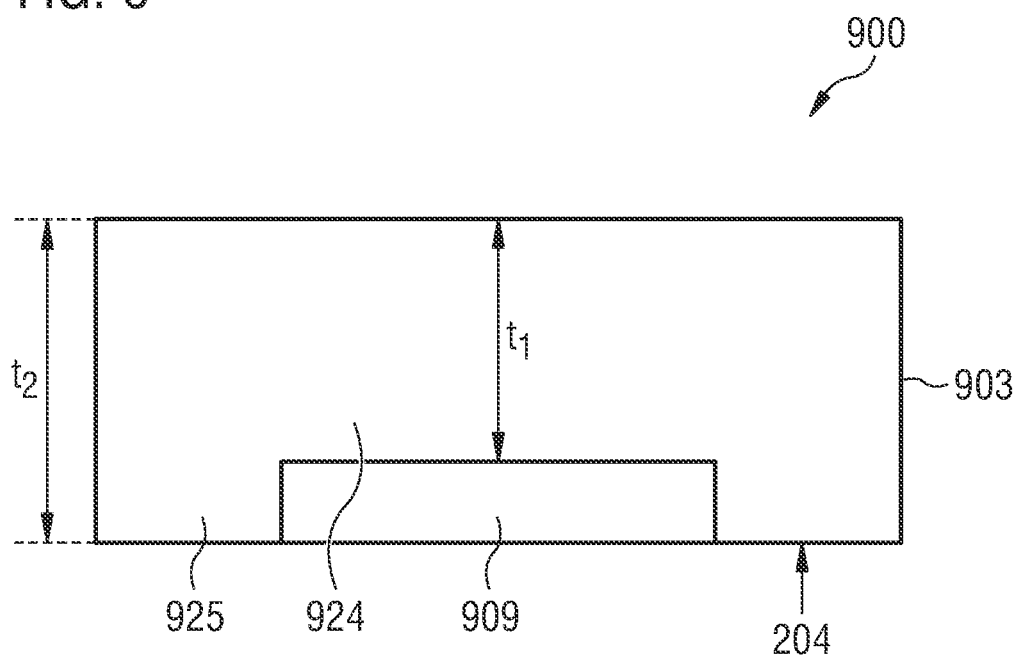
FIG. 9 shows a schematic illustration of a semiconductor device.

FIG. 9 shows a schematic illustration of a semiconductor device 900. For example, FIG. 9 shows a two-dimensional view of at least part of the semiconductor device 900 at a cross-section extending vertically through the semiconductor device 900, for example.

The semiconductor device 900 comprises a back side metallization layer structure 909 formed on a thinned portion 924 of a semiconductor substrate 903. The thinned portion 924 of the semiconductor substrate has a first thickness, t1. The semiconductor device 900 further comprises an edge portion 925 of the semiconductor substrate 903 located at the second lateral surface 204 of the semiconductor substrate 903 at an edge of the semiconductor substrate 903. The edge portion 925 of the semiconductor substrate 903 has a second thickness, t2. The second thickness, t2, is larger than the first thickness, t1.

Due to the edge portion 925 of the semiconductor substrate 903 having a thickness larger than a thickness of the thinned portion of the semiconductor substrate, the semiconductor device may have improved stabilization, for example.

The maximum (or largest) thickness of the thinned portion 924 of the semiconductor device (e.g. the first thickness, t1) may lie between 4 µm and 200 µm (or e.g. between 4 µm and 100 µm, or e.g. between 4 µm and 40 µm), for example.

The minimum (or smallest) thickness of the edge portion 925 (e.g. the second thickness, t2) may be at least 1.2 times (or e.g. at least 1.5 times, or e.g. at least 2 times, or e.g. at least 4 times, or e.g. at least 5 times) thicker than the maximum (or largest) first thickness of the thinned portion of the semiconductor chip region, for example. For example, the minimum (or smallest) thickness of the edge portion (e.g. the second thickness, t2,) may lie between 6 µm and 150 µm (or e.g. between 10 µm and 100 µm, or e.g. between 20 µm and 80 µm), for example.

A maximum (or largest) lateral width, ew, (shown in FIGS. 10A and 10B) of the edge portion 925 may lie between 1% and 25% (or e.g. between 5% and 20%, or e.g. between 5% and 15%) of a minimum (or smallest) lateral width of the semiconductor device, for example. For example, the maximum lateral width of the edge portion 925 may lie between 5 µm and 50 µm (or e.g. between 10 µm and 30 µm, or e.g. between 10 µm and 20 µm), for example.

A lateral dimension (e.g. a width, or e.g. a length) of the semiconductor device may lie between 50 nm and several millimeters, (or e.g. between 10 µm and 10 mm, or e.g. between 50 µm and 30 mm), for example.

The back side metallization layer structure 909 may be an electrically conductive drain electrode structure (or e.g. a cathode structure) of at least one electrical structure of the semiconductor device 900, for example. The at least one electrical structure may include (or may be) at least part of a diode structure or a transistor structure, (e.g. a MOSFET transistor structure, or an IGBT transistor structure), for example. For example, forming the at least one electrical structure may include forming a cathode or anode region of a diode structure in the semiconductor chip region. For example, forming the at least one electrical structure may include forming a body region, a source region and/or a drift region of a transistor structure in the semiconductor chip region, for example. For example, forming the at least one electrical structure may further include forming a metallization layer structure (e.g. a source electrode structure, or e.g. a gate electrode structure, or e.g. an anode structure) of the at least one electrical structure at (or e.g. on) the first lateral surface of the semiconductor wafer.

A maximum thickness of the back side metallization layer structure 909 may be substantially equal to (or e.g. may lie within +/−10%, or e.g. within +/−5%, or +/−1% of) a difference between the second thickness and the first thickness, for example.

The edge portion 925 of the semiconductor substrate 903 may laterally surround the back side metallization layer structure 909 (e.g. in a top view of the semiconductor device), for example.

Optionally, the edge portion 925 of the semiconductor substrate 903 may include substantially vertical sidewalls without tapering (e.g. a first substantially vertical sidewall and a second substantially vertical sidewall). For example, a vertical sidewall of the edge portion may be located (directly) adjacent to a back side metallization layer structure 909 formed on the thinned portion 924 of the semiconductor substrate 903.

Optionally or alternatively, the edge portion 925 of the semiconductor substrate 903 may include at least one beveled sidewall (e.g. with tapering). For example, the beveled sidewall of the edge portion 925 may be located between the back side metallization layer structure 909 and an edge of the semiconductor substrate 903. For example, the beveled sidewall of the edge portion 925 may be located (directly) adjacent to the back side metallization layer structure formed on the thinned portion 924 of the semiconductor substrate 903, for example.

An angle between the beveled sidewall and a second lateral surface 204 of a thinned portion 724 of the semiconductor substrate 903 may lie between 90° and 130° (or e.g. between 95° and 130°, or e.g. between 95° and 120°), for example. The angle may be between an approximated line of fitting of the beveled sidewall and the second lateral surface 204 of the thinned portion 724 of the semiconductor substrate 903, for example.

Optionally, the semiconductor substrate may include an insulation layer structure buried in the semiconductor substrate 903. At least part of the insulation layer structure may be located on the thinned portion 924 of the semiconductor substrate 903, for example. Optionally, at least part of the insulation layer structure may be located between the back side metallization layer structure 909 and the thinned portion 924 of the semiconductor substrate 903, for example. The insulation layer structure may have been part of an etch stop layer structure for forming the semiconductor device 900, for example.

Optionally, the semiconductor device 900 may include passivation material (e.g. an electrically insulating material) formed on the edges or sidewalls of the semiconductor device. The passivation material may be may be a carbon (C) based material, a silicon nitride (SiNx) based material, a silicon dioxide ($SiO_2$) based material or an amorphous silicon carbide (a-SiC) based material, for example.

The semiconductor device may be a semiconductor chip or a semiconductor die, for example. The semiconductor device to be manufactured may, optionally, be a power semiconductor device. A power semiconductor device or an electrical structure (e.g. transistor structure or diode structure) of the power semiconductor device may have a breakdown voltage or blocking voltage of more than boy (or e.g. more than 100 V, or e.g. more than 500 V, or e.g. more than 1000 V), for example. Optionally or alternatively, the semiconductor device to be manufactured may be a non-power semiconductor device. For example, an electrical structure of the power semiconductor device may be a memory structure, or e.g. a circuit for a central processing unit (CPU).

More details and aspects are mentioned in connection with the embodiments described above or below. The embodiments shown in FIG. 9 may comprise one or more optional additional features corresponding to one or more aspects mentioned in connection with the proposed concept or one or more embodiments described above (e.g. FIGS. 1 to 8C) or below (e.g. FIGS. 10A to 10B).

Figure 10A:
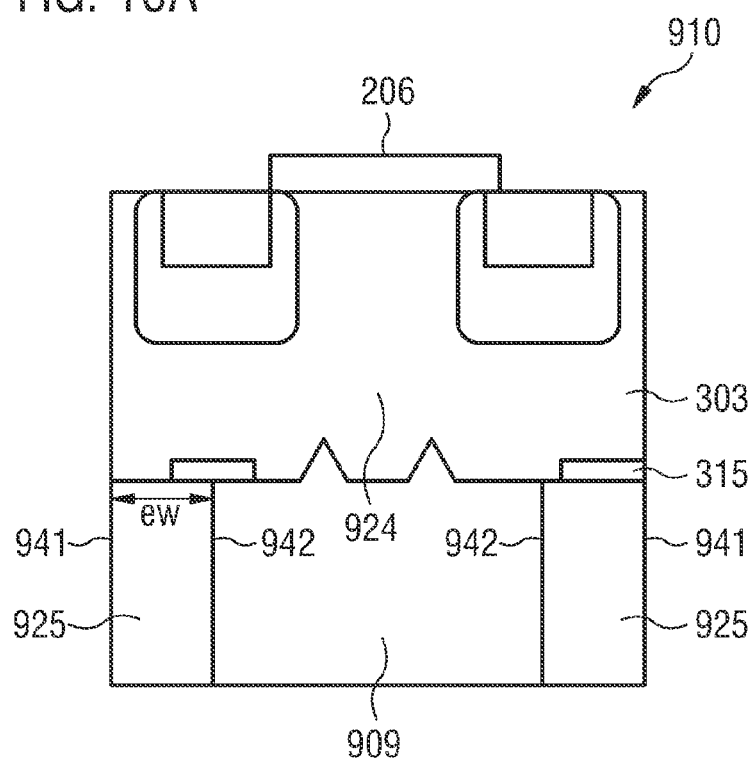
FIG. 10A shows a schematic illustration of a semiconductor device comprising an edge portion comprising vertical sidewalls.

FIG. 10A shows a schematic illustration of a semiconductor device 910. For example, FIG. 10A shows a two-dimensional view of at least part of a semiconductor device 910 at a cross-section extending vertically through the semiconductor device 910.

The semiconductor device 910 described in connection with FIG. 10A may include one or more or all of the features of the method described in connection with the semiconductor device of FIG. 9, for example.

As shown in FIG. 10A, the edge portion 925 of the semiconductor substrate 903 may include substantially vertical sidewalls (e.g. a first substantially vertical sidewall 941 and a second substantially vertical sidewall 942 without taper). For example, a vertical sidewall 942 of the edge portion 925 may be located (directly) laterally adjacent to a back side metallization layer structure 909 formed on the thinned portion 924 of the semiconductor substrate 903.

Additionally, the semiconductor substrate 903 may include an insulation layer structure 315 buried in the semiconductor substrate 903. At least part of the etch stop layer structure 315 may be located on the thinned portion 924 of the semiconductor substrate 903, for example. Optionally, at least part of the etch stop layer structure 315 may be located between the back side metallization layer structure 909 and the thinned portion 924 of the semiconductor substrate 903, for example.

Figure 10B:
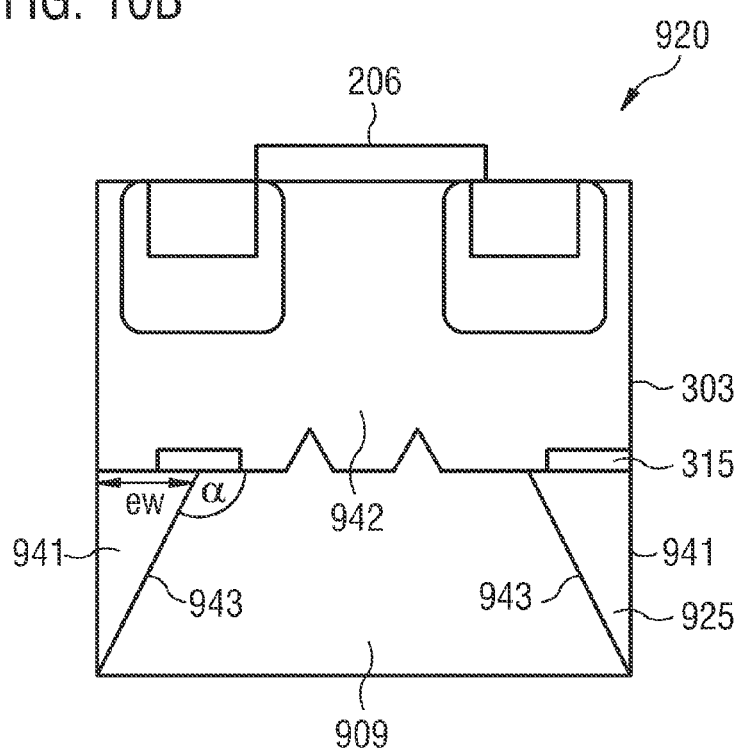
FIG. 10B shows a schematic illustration of a semiconductor device comprising an edge portion comprising at least one beveled sidewall.

FIG. 10B shows a schematic illustration of a semiconductor device 920. For example, FIG. 10B shows a two-dimensional view of at least part of a semiconductor device 920 at a cross-section extending vertically through the semiconductor device 920.

The semiconductor device 920 described in connection with FIG. 10B may include one or more or all of the features of the method described in connection with the semiconductor device of FIG. 10A, for example.

However, the edge portion 925 of the semiconductor substrate 903 may include at least one beveled sidewall 943 (e.g. a taper). For example, the beveled sidewall 943 of the edge portion 925 may be located between the back side metallization layer structure 909 and an edge (e.g. a vertical edge) of the semiconductor substrate 903. For example, the beveled sidewall 943 of the edge portion 925 may be located (directly) adjacent to the back side metallization layer structure 909 formed on the thinned portion 924 of the semiconductor substrate 903, for example.

An angle, a, between the beveled sidewall 943 and a second lateral surface 204 of a thinned portion 724 of the semiconductor substrate 903 may lie between 90° and 130° (or e.g. between 95° and 130°, or e.g. between 95° and 120°), for example. The angle may be between an approximated line of fitting of the beveled sidewall and the second lateral surface 204 of the thinned portion 724 of the semiconductor substrate 903, for example.

More details and aspects are mentioned in connection with the embodiments described above or below. The embodiments shown in FIGS. 10A to 10B may each comprise one or more optional additional features corresponding to one or more aspects mentioned in connection with the proposed concept or one or more embodiments described above (e.g. FIGS. 1 to 9) or below.

Various examples relate to concepts for thin die separation by plasma dicing before grinding from the beginning.

Aspects and features (e.g. the plurality of trenches, the first lateral surface of the semiconductor wafer, the second lateral surface of the semiconductor wafer, the semiconductor wafer, the filler material, the thinned semiconductor wafer, the back side metallization structure, the semiconductor chip regions, the at least one electrical structure, the etch stop layer structure, the trench void, the first filler material portion, the second filler material portion, the thinned portions of the plurality of semiconductor chip regions, the edge portions of the plurality of semiconductor chip regions, the first thickness, the second thickness, the beveled sidewall, the forming of the plurality of trenches, the filling of the plurality of trenches, the thinning of the semiconductor wafer, the forming of the back side metallization layer structure, the individualizing of the semiconductor chip regions) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a plurality of semiconductor devices, the method comprising:
forming a plurality of trenches extending from a first lateral surface of a semiconductor wafer towards a second lateral surface of the semiconductor wafer;
filling a portion of the plurality of trenches with a filler material;
forming a part of an electrical structure of a semiconductor device in a semiconductor chip region of a plurality of semiconductor chip regions after filling the portion of the plurality of trenches with filler material;
thinning the semiconductor wafer from the second lateral surface of the semiconductor wafer to form a thinned semiconductor wafer;
forming a back side metallization layer structure on the plurality of semiconductor chip regions of the semiconductor wafer after thinning the semiconductor wafer, wherein the plurality of semiconductor chip regions of the semiconductor wafer are located between the plurality of trenches; and removing a part of the filler material from the plurality of trenches after forming the back side metallization layer structure to obtain the plurality of semiconductor devices.

2. The method according to claim 1, wherein thinning the semiconductor wafer comprises removing semiconductor wafer material from the second lateral surface of the semiconductor wafer to uncover the plurality of trenches comprising the filler material at the second lateral surface of the thinned semiconductor wafer.

3. The method according to claim 1, wherein a maximum thickness of the thinned semiconductor wafer after thinning the semiconductor wafer is less than 100 μm.

4. The method according to claim 1, wherein an average lateral width of a trench of the plurality of trenches located between neighboring semiconductor chip regions of the plurality of semiconductor chip regions is less than 15 μm.

5. The method according to claim 1, further comprising etching the filler material located in the plurality of trenches from the second lateral surface of the semiconductor wafer after thinning the semiconductor wafer so that a maximum depth of the plurality of trenches comprising the filler material is less than a thickness of the thinned semiconductor wafer.

6. The method according to claim 1, wherein thinning the semiconductor wafer comprises thinning the semiconductor wafer from the second lateral surface of the semiconductor wafer until an etch stop layer structure of the semiconductor wafer is uncovered at the second lateral surface of the thinned semiconductor wafer.

7. The method according to claim 6, wherein the etch stop layer structure of the semiconductor wafer extends laterally over at least 70% of a lateral area of the semiconductor wafer.

8. The method according to claim 6, further comprising removing the part of the etch stop layer structure of the semiconductor wafer before forming the back side metallization layer structure on the plurality of semiconductor chip regions of the semiconductor wafer.

9. The method according to claim 6, wherein the plurality of trenches extend from the first lateral surface of a semiconductor wafer to a vertical level of the etch stop layer structure of the semiconductor wafer.

10. The method according to claim 1, wherein the filler material is a carbon based material, a silicon nitride based material, a silicon dioxide based material, an amorphous silicon carbide based material, a glue, or a stretchable material.

11. A method for forming a plurality of semiconductor devices, the method comprising:
forming a plurality of trenches extending from a first lateral surface of a semiconductor wafer towards a second lateral surface of the semiconductor wafer;
filling a portion of the plurality of trenches with a filler material;
thinning the semiconductor wafer from the second lateral surface of the semiconductor wafer to form a thinned semiconductor wafer, wherein the thinning the semiconductor wafer comprises thinning portions of the semiconductor wafer between neighboring trenches of the plurality of trenches to a first thickness, and wherein each semiconductor chip region of a plurality of semiconductor chip regions comprises an edge portion located at an edge of the semiconductor chip region after thinning the semiconductor wafer, wherein each edge portion of the semiconductor chip region has a second thickness, wherein the second thickness is larger than the first thickness;
forming a back side metallization layer structure on the plurality of semiconductor chip regions of the semiconductor wafer after thinning the semiconductor wafer, wherein the plurality of semiconductor chip regions of the semiconductor wafer are located between the plurality of trenches; and
removing a part of the filler material from the plurality of trenches after forming the back side metallization layer structure to obtain the plurality of semiconductor devices.

12. A method for forming a plurality of semiconductor devices, the method comprising:
forming a plurality of trenches extending from a first lateral surface of a semiconductor wafer towards a second lateral surface of the semiconductor wafer;
filling a portion of the plurality of trenches with a filler material, wherein filling the portion of the plurality of trenches with the filler material comprises forming a void within the plurality of trenches;
thinning the semiconductor wafer from the second lateral surface of the semiconductor wafer to form a thinned semiconductor wafer;
forming a back side metallization layer structure on a plurality of semiconductor chip regions of the semiconductor wafer after thinning the semiconductor wafer, wherein the plurality of semiconductor chip regions of the semiconductor wafer are located between the plurality of trenches; and
removing a part of the filler material from the plurality of trenches after forming the back side metallization layer structure to obtain the plurality of semiconductor devices.

13. The method according to claim 11, wherein thinning the semiconductor wafer comprises removing semiconductor wafer material from the second lateral surface of the semiconductor wafer to uncover the plurality of trenches comprising the filler material at the second lateral surface of the thinned semiconductor wafer.

14. The method according to claim 11, wherein a maximum thickness of the thinned semiconductor wafer after thinning the semiconductor wafer is less than 100 μm.

15. The method according to claim 11, wherein an average lateral width of a trench of the plurality of trenches located between neighboring semiconductor chip regions of the plurality of semiconductor chip regions is less than 15 μm.

16. The method according to claim 11, wherein removing the part of the filler material comprises further comprising etching the filler material located in the plurality of trenches from the second lateral surface of the semiconductor wafer so that a maximum depth of the plurality of trenches comprising the filler material is less than a thickness of the thinned semiconductor wafer.

17. The method according to claim 11, wherein the filler material is a carbon based material, a silicon nitride based material, a silicon dioxide based material, an amorphous silicon carbide based material, a glue, or a stretchable material.

18. The method according to claim 12, wherein thinning the semiconductor wafer comprises removing semiconductor wafer material from the second lateral surface of the semiconductor wafer to uncover the plurality of trenches comprising the filler material at the second lateral surface of the thinned semiconductor wafer.

19. The method according to claim 12, wherein a maximum thickness of the thinned semiconductor wafer after thinning the semiconductor wafer is less than 100 µm.

20. The method according to claim 12, wherein an average lateral width of a trench of the plurality of trenches located between neighboring semiconductor chip regions of the plurality of semiconductor chip regions is less than 15 µm.

21. The method according to claim 12, wherein removing the part of the filler material comprises further comprising etching the filler material located in the plurality of trenches from the second lateral surface of the semiconductor wafer so that a maximum depth of the plurality of trenches comprising the filler material is less than a thickness of the thinned semiconductor wafer.

22. The method according to claim 12, wherein the filler material is a carbon based material, a silicon nitride based material, a silicon dioxide based material, an amorphous silicon carbide based material, a glue, or a stretchable material.

23. A method for forming a plurality of semiconductor devices, the method comprising:
forming a plurality of trenches extending from a first lateral surface of a semiconductor wafer towards a second lateral surface of the semiconductor wafer;
filling a portion of the plurality of trenches with a filler material;
thinning the semiconductor wafer from the second lateral surface of the semiconductor wafer to form a thinned semiconductor wafer, wherein thinning the semiconductor wafer comprises thinning the semiconductor wafer from the second lateral surface of the semiconductor wafer until an etch stop layer structure of the semiconductor wafer is uncovered at the second lateral surface of the thinned semiconductor wafer;
forming a back side metallization layer structure on a plurality of semiconductor chip regions of the semiconductor wafer after thinning the semiconductor wafer, wherein the plurality of semiconductor chip regions of the semiconductor wafer are located between the plurality of trenches; and
removing a part of the filler material from the plurality of trenches after forming the back side metallization layer structure to obtain the plurality of semiconductor devices.

24. The method according to claim 23, wherein the etch stop layer structure of the semiconductor wafer extends laterally over at least 70% of a lateral area of the semiconductor wafer.

25. The method according to claim 23, further comprising removing the part of the etch stop layer structure of the semiconductor wafer before forming the back side metallization layer structure on the plurality of semiconductor chip regions of the semiconductor wafer.

26. The method according to claim 23, wherein thinning the semiconductor wafer comprises removing the etch stop layer structure.

27. The method according to claim 23, wherein the plurality of trenches extend from the first lateral surface of a semiconductor wafer to a vertical level of the etch stop layer structure of the semiconductor wafer.

28. The method according to claim 23, wherein thinning the semiconductor wafer comprises removing semiconductor wafer material from the second lateral surface of the semiconductor wafer to uncover the plurality of trenches comprising the filler material at the second lateral surface of the thinned semiconductor wafer.

29. The method according to claim 23, wherein a maximum thickness of the thinned semiconductor wafer after thinning the semiconductor wafer is less than 100 µm.

30. The method according to claim 23, wherein an average lateral width of a trench of the plurality of trenches located between neighboring semiconductor chip regions of the plurality of semiconductor chip regions is less than 15 µm.

31. The method according to claim 23, wherein removing the part of the filler material comprises further comprising etching the filler material located in the plurality of trenches from the second lateral surface of the semiconductor wafer so that a maximum depth of the plurality of trenches comprising the filler material is less than a thickness of the thinned semiconductor wafer.

32. The method according to claim 23, wherein the filler material is a carbon based material, a silicon nitride based material, a silicon dioxide based material, an amorphous silicon carbide based material, a glue, or a stretchable material.

* * * * *